United States Patent
Tang et al.

(10) Patent No.: US 11,182,096 B1
(45) Date of Patent: Nov. 23, 2021

(54) DATA STORAGE SYSTEM WITH CONFIGURABLE DURABILITY

(71) Applicant: Amazon Technologies, Inc., Seattle, WA (US)

(72) Inventors: Kun Tang, Bellevue, WA (US); Hon Ping Shea, Seattle, WA (US)

(73) Assignee: Amazon Technologies, Inc., Seattle, WA (US)

( * ) Notice: Subject to any disclaimer, the term of this patent is extended or adjusted under 35 U.S.C. 154(b) by 4 days.

(21) Appl. No.: 16/877,273

(22) Filed: May 18, 2020

(51) Int. Cl.
*G06F 3/06* (2006.01)
*H03M 13/15* (2006.01)
*G06F 9/54* (2006.01)

(52) U.S. Cl.
CPC .......... *G06F 3/065* (2013.01); *G06F 3/0619* (2013.01); *G06F 3/0673* (2013.01); *G06F 9/541* (2013.01); *H03M 13/154* (2013.01)

(58) Field of Classification Search
None
See application file for complete search history.

(56) References Cited

U.S. PATENT DOCUMENTS

| | | | |
|---|---|---|---|
| 6,061,600 A | 5/2000 | Ying | |
| 6,456,599 B1 | 9/2002 | Elliott | |
| 6,466,559 B1 * | 10/2002 | Johansson | H04J 13/16 370/335 |
| 7,254,682 B1 | 8/2007 | Arbon | |
| 7,254,813 B2 * | 8/2007 | Leong | G06F 3/0601 710/5 |
| 7,596,712 B1 | 9/2009 | Gole et al. | |
| 7,640,547 B2 * | 12/2009 | Neiman | G06F 9/5044 705/5 |
| 7,702,618 B1 | 4/2010 | Patterson | |
| 7,730,364 B2 * | 6/2010 | Chang | G06F 11/0709 714/47.2 |
| 7,752,180 B1 | 7/2010 | Fair et al. | |

(Continued)

FOREIGN PATENT DOCUMENTS

| | | |
|---|---|---|
| WO | 2014039922 | 3/2014 |
| WO | 2016130301 | 8/2016 |

OTHER PUBLICATIONS

U.S. Appl. No. 14/625,535, filed Feb. 18, 2015, Surya Prakash Dhoolam.

(Continued)

*Primary Examiner* — Elias Mamo
(74) *Attorney, Agent, or Firm* — Robert C. Kowert; Kowert, Hood, Munyon, Rankin & Goetzel, P.C.

(57) ABSTRACT

A fault-tolerant data storage system associates durability requirements of service level agreements (SLAs) for volumes stored in the fault-tolerant data storage system with volume partitions stored in the fault-tolerant data storage system. For a given volume partition, volume data is stored in two or more replicas on two or more different system components and/or erasure encoded across multiple other system components. The fault-tolerant data storage system uses the respective durability requirements of the SLAs and failure statistics of the system components to allocate bandwidth for replacing lost instances of redundantly stored volume data such that the lost data is replaced within a target time calculated to guarantee the durability requirements of the SLAs are satisfied.

20 Claims, 22 Drawing Sheets

(56) References Cited

U.S. PATENT DOCUMENTS

| | | | |
|---|---|---|---|
| 7,822,930 B1* | 10/2010 | Frazier | G06F 9/5011 |
| | | | 711/151 |
| 7,941,621 B1 | 5/2011 | Gipp et al. | |
| 8,589,550 B1 | 11/2013 | Faibish et al. | |
| 8,688,660 B1 | 4/2014 | Sivasubramanian et al. | |
| 9,075,773 B1 | 7/2015 | Rakitzis et al. | |
| 9,304,867 B2 | 4/2016 | Sivasubramanian et al. | |
| 9,342,457 B2 | 5/2016 | Wei et al. | |
| 9,563,385 B1 | 2/2017 | Kowalski et al. | |
| 9,619,429 B1 | 4/2017 | Wang et al. | |
| 9,722,976 B1 | 8/2017 | Li et al. | |
| 9,733,862 B1 | 8/2017 | Klemm et al. | |
| 9,787,654 B2 | 10/2017 | Vincent et al. | |
| 9,985,904 B2 | 5/2018 | Shalev et al. | |
| 10,055,352 B2 | 8/2018 | Wei et al. | |
| 10,057,187 B1 | 8/2018 | Dhoolam et al. | |
| 10,148,570 B2 | 12/2018 | Shalev et al. | |
| 10,484,015 B2 | 11/2019 | Kusters et al. | |
| 10,514,847 B2 | 12/2019 | Kusters et al. | |
| 10,521,135 B2 | 12/2019 | Kusters et al. | |
| 2001/0044879 A1 | 11/2001 | Moulton et al. | |
| 2002/0108017 A1 | 8/2002 | Kenchammana-Hoskote et al. | |
| 2003/0061362 A1* | 3/2003 | Qiu | H04N 7/17345 |
| | | | 709/229 |
| 2003/0110409 A1 | 6/2003 | Gale et al. | |
| 2004/0111557 A1 | 6/2004 | Nakatani et al. | |
| 2004/0127277 A1 | 7/2004 | Walker et al. | |
| 2005/0138461 A1 | 6/2005 | Allen et al. | |
| 2005/0198371 A1 | 9/2005 | Smith et al. | |
| 2006/0155946 A1 | 7/2006 | Ji | |
| 2007/0174660 A1 | 7/2007 | Peddada | |
| 2008/0002580 A1 | 1/2008 | Kawada et al. | |
| 2008/0205399 A1 | 8/2008 | Delesalle et al. | |
| 2009/0217067 A1 | 8/2009 | Radhakrishnan et al. | |
| 2010/0074157 A1 | 3/2010 | Doh et al. | |
| 2010/0180153 A1 | 7/2010 | Jernigan, IV | |
| 2010/0198972 A1 | 8/2010 | Umbehocker | |
| 2011/0078108 A1 | 3/2011 | Kumar | |
| 2011/0179231 A1 | 7/2011 | Roush | |
| 2012/0030426 A1 | 2/2012 | Satran | |
| 2013/0282978 A1 | 10/2013 | Kumar et al. | |
| 2014/0006543 A1 | 1/2014 | Pitts | |
| 2014/0047263 A1 | 2/2014 | Coatney et al. | |
| 2014/0092833 A1 | 4/2014 | Vannithamby et al. | |
| 2014/0108755 A1 | 4/2014 | Lue et al. | |
| 2014/0164694 A1 | 6/2014 | Walter | |
| 2014/0201483 A1 | 7/2014 | Min | |
| 2014/0304383 A1 | 10/2014 | Guo et al. | |
| 2015/0036284 A1 | 2/2015 | Ross et al. | |
| 2015/0121028 A1 | 4/2015 | Gupta et al. | |
| 2015/0222705 A1 | 8/2015 | Stephens | |
| 2015/0261443 A1 | 9/2015 | Wei et al. | |
| 2015/0261674 A1 | 9/2015 | Wei et al. | |
| 2015/0278243 A1 | 10/2015 | Pradeep et al. | |
| 2015/0309892 A1 | 10/2015 | Ramasubramaniam et al. | |
| 2015/0313028 A1 | 10/2015 | Bell et al. | |
| 2015/0324123 A1 | 11/2015 | Storer et al. | |
| 2015/0362983 A1 | 12/2015 | Frick | |
| 2015/0378762 A1 | 12/2015 | Saladi et al. | |
| 2016/0073544 A1 | 3/2016 | Heyd et al. | |
| 2016/0085674 A1 | 3/2016 | Sterns et al. | |
| 2016/0182305 A1 | 6/2016 | Martin et al. | |
| 2016/0246677 A1 | 8/2016 | Sangamkar et al. | |
| 2016/0246719 A1 | 8/2016 | Teletia et al. | |
| 2016/0292025 A1 | 10/2016 | Gupta et al. | |
| 2016/0320978 A1 | 11/2016 | Barve et al. | |
| 2016/0328168 A1 | 11/2016 | Danny et al. | |
| 2016/0342349 A1 | 11/2016 | Borlick et al. | |
| 2016/0371145 A1 | 12/2016 | Akutsu et al. | |
| 2017/0054626 A1 | 2/2017 | Sivabalan et al. | |
| 2017/0063397 A1 | 3/2017 | Richardson et al. | |
| 2017/0161162 A1 | 6/2017 | Blea et al. | |
| 2017/0177222 A1 | 6/2017 | Singh et al. | |
| 2017/0223717 A1 | 8/2017 | Athani | |
| 2017/0262191 A1 | 9/2017 | Dewakar et al. | |
| 2017/0277590 A1 | 9/2017 | Luse et al. | |
| 2017/0364295 A1 | 12/2017 | Sardinha et al. | |
| 2017/0371573 A1 | 12/2017 | Kim et al. | |
| 2018/0004414 A1 | 1/2018 | Danilov et al. | |
| 2018/0011642 A1 | 1/2018 | Koseki et al. | |
| 2018/0097657 A1 | 4/2018 | Dao et al. | |
| 2018/0150256 A1 | 5/2018 | Kumar et al. | |
| 2018/0183868 A1 | 6/2018 | Kusters et al. | |
| 2020/0083909 A1 | 3/2020 | Kusters et al. | |
| 2020/0125271 A1 | 4/2020 | Kusters et al. | |

OTHER PUBLICATIONS

U.S. Appl. No. 14/643,479, filed Mar. 10, 2015, Christopher Magee Greenwood.
U.S. Appl. No. 14/642,445, filed Mar. 9, 2015, Marc John Brooker.
U.S. Appl. No. 12/749,449, filed Mar. 29, 2010, Tate Andrew Certain.
Salvador Esparza et al "Oracle Exalogic Elastic Cloud Machine Owner's Guide" Apr. 30, 2015, pp. 1-302.
U.S. Appl. No. 16/684,992, filed Nov. 15, 2019, Norbert P. Kusters.
U.S. Appl. No. 15/392,835, filed Dec. 28, 2016, Norbert P. Kusters.
U.S. Appl. No. 16/723,391, filed Dec. 20, 2019, Norbert P. Kusters.
U.S. Appl. No. 15/392,878, filed Dec. 28, 2016, Norbert P. Kusters.
U.S. Appl. No. 16/827,565, filed Mar. 23, 2020, Kun Tang.
U.S. Appl. No. 15/433,956, filed Feb. 15, 2017, Norbert Paul Kusters.
U.S. Appl. No. 16/457,095, filed Jun. 28, 2019, Norbert Paul Kusters.
U.S. Appl. No. 16/457,008, filed Jun. 28, 2019, Norbert Paul Kusters.
U.S. Appl. No. 16/832,982, filed Mar. 27, 2020, Kun Tang.

* cited by examiner

DATA STORAGE SYSTEM WITH CONFIGURABLE DURABILITY

BACKGROUND

Advances in technologies for dynamically sharing virtualizations of hardware resources, software, and information storage across networks has increased the reliability, scalability, and cost efficiency of computing. More specifically, the ability to provide on demand virtual computing resources and storage through the advent of virtualization has enabled consumers of processing resources and storage to flexibly structure their computing and storage costs in response to immediately perceived computing and storage needs. Virtualization allows customers to purchase processor cycles and storage at the time of demand, rather than buying or leasing fixed hardware in provisioning cycles that are dictated by the delays and costs of manufacture and deployment of hardware. Rather than depending on the accuracy of predictions of future demand to determine the availability of computing and storage, users are able to purchase the use of computing and storage resources on a relatively instantaneous as-needed basis.

Virtualized computing environments are frequently supported by block-based storage. Such block-based storage provides a storage system that is able to interact with various computing virtualizations through a series of standardized storage calls that render the block-based storage functionally agnostic to the structural and functional details of the volumes that it supports and the operating systems executing on the virtualizations to which it provides storage availability. Availability generally refers to a level of operational performance, such as "uptime," in which a computing system or workload is accessible.

Figure 1A:
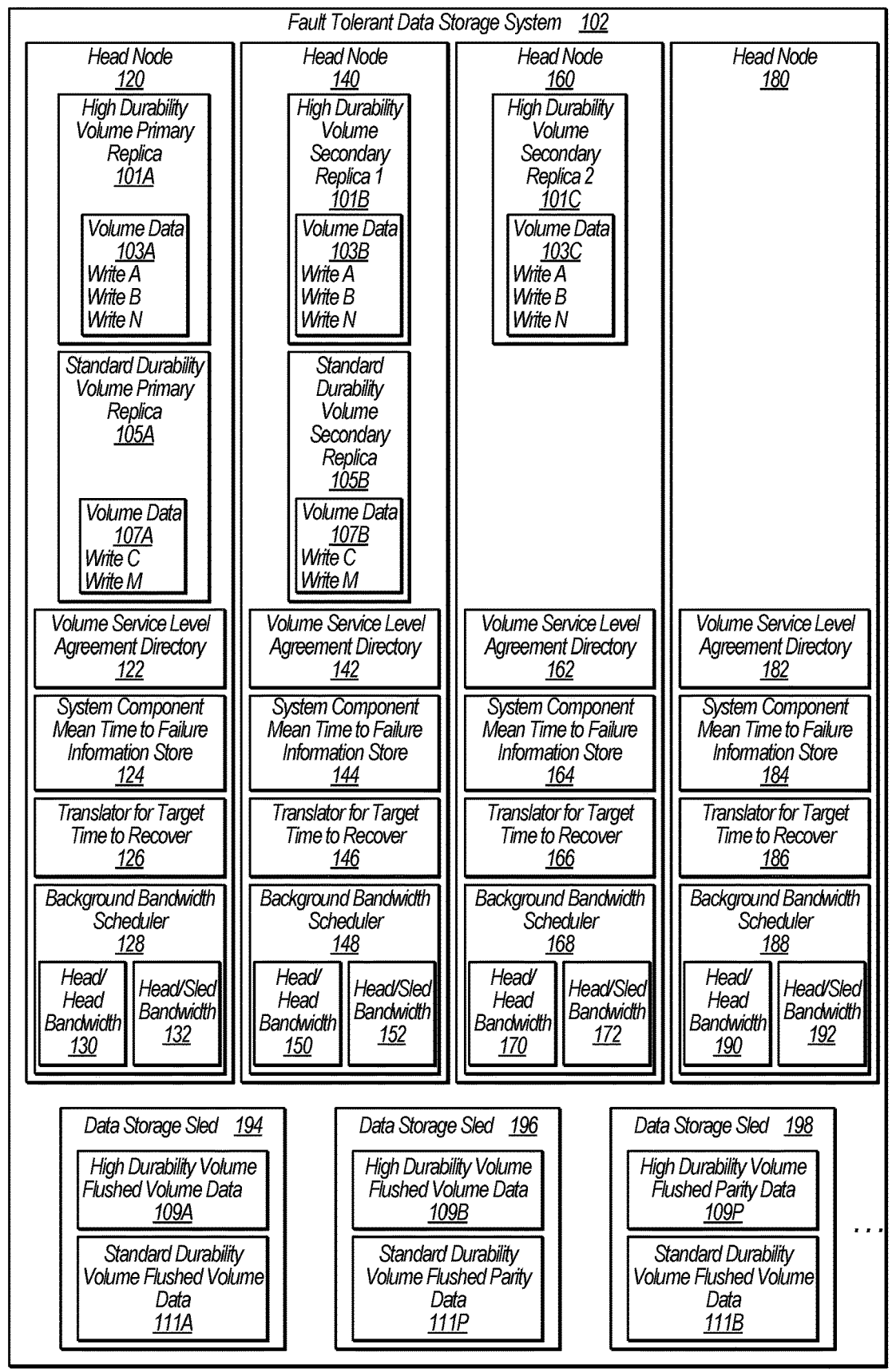
FIG. 1A illustrates a fault-tolerant data storage system including head nodes and data storage sleds, wherein the fault-tolerant data storage system stores volumes with different durability requirements, according to some embodiments.

While embodiments are described herein by way of example for several embodiments and illustrative drawings, those skilled in the art will recognize that the embodiments are not limited to the embodiments or drawings described. It should be understood, that the drawings and detailed description thereto are not intended to limit embodiments to the particular form disclosed, but on the contrary, the intention is to cover all modifications, equivalents and alternatives falling within the spirit and scope as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include", "including", and "includes" mean including, but not limited to.

DETAILED DESCRIPTION

Generally described, aspects of the present disclosure relate to providing independently configurable durability for volumes stored in a fault-tolerant data storage system, such as may be included in a block-based storage service of a cloud service provider network. The independently configurable durability of the volumes/volume partitions allows more system resources of the fault-tolerant data storage system to be allocated to volumes/volume partitions with higher durability requirements while conserving system resources in regard to volumes/volume partitions with lower durability requirements. Thus, a fault-tolerant data storage system is enabled to support volumes with varying durability requirements efficiently by allocating resources to volumes with higher durability requirements to ensure the higher durability requirements are met while, at the same time, not provisioning excess system resources to volumes with lower durability requirements.

Generally described, another aspect of the present disclosure relates to automatically adapting how systems resources of a fault-tolerant data storage system are allocated to volumes/volume partitions to meet durability requirements of the volumes/volume partitions in response to hardware anomalies or software bugs. For example, in some embodiments failure statistics are maintained for hardware and/or software components of the fault-tolerant data storage system. These failure statistics are used to determine probabilities of future failures or software issues in components of the fault-tolerant data storage system. Based on these probabilities/failure statistics, allocations of system resources of the fault-tolerant data storage system to volumes/volume partitions with varying durability requirements are automatically adjusted to compensate for the hardware anomalies or software bugs, such that the hardware anomalies or software bugs are accounted for in allocation decisions. Thus, the fault-tolerant data storage system is enabled to provide consistent durability performance for volumes/volume partitions with varying durability requirements despite experiencing hardware anomalies and/or software bugs.

Generally described, another aspect of the present disclosure relates to providing customers of a block-based data storage service (referred to in various implementations as a cloud disks service, a managed disk service, a storage area network service, a persistent disk service, or a block volumes service) with an interface for selecting or specifying durability requirements of volumes stored, or to be stored, in the block-based data storage service on behalf of the customers. For example, some customers may store different types of data or use the storage service for different applications, such that some customers may be more sensitive to data loss than others. As an example, some customers may be willing to accept lower durability guarantees in exchange for lower costs to store data, while other customers may be willing to accept higher storage costs in exchange for greater data durability guarantees. Thus, instead of a one size-fits-all approach to durability, in some embodiments customers may be provided with an interface to select or specify particular durability requirements desired for particular volume stored in the block-based storage system on behalf of the customers.

In general, a virtualized block storage volume (referred to in various implementations as a cloud disk, storage disk, cloud volume, disk, block volume, or simple "volume") can correspond to a logical collection of data, such as a set of data maintained on behalf of a user. The data of the volume may be erasure coded and/or replicated between multiple devices within a distributed computing system, in order to provide multiple replicas of the volume (where such replicas may collectively represent the volume on the computing system). Replicas of a volume in a distributed computing system can beneficially provide for automatic failover and recovery, for example by allowing the user to access either a primary replica of a volume or a secondary replica of the volume that is synchronized to the primary replica at a block level, such that a failure of either the primary or secondary replica does not inhibit access to the information of the volume. The role of the primary replica can be to facilitate reads and writes (sometimes referred to as "input output operations," or simply "I/O operations") at the volume, and to propagate any writes to the secondary (preferably synchronously in the I/O path, although asynchronous replication can also be used). The secondary replica can be updated synchronously with the primary replica and provide for seamless transition during failover operations, whereby the secondary replica assumes the role of the primary replica, and either the former primary is designated as the secondary or a new replacement secondary replica is provisioned. Although certain examples herein discuss a primary replica and a secondary replica, it will be appreciated that a logical volume can include multiple secondary replicas.

In order to provide independently configurable durability for volumes, automatic resource allocation adjustments, and/or customer configurable durability for volumes, a fault-tolerant data storage system includes storage servers each having a plurality of head nodes and a plurality of data storage sleds, wherein the head nodes include a translator that takes volume durability requirements and system component failure statistics as inputs and determines target replacement times for replacing redundantly stored lost data in order to meet the durability requirements. Also, the head nodes include a background bandwidth scheduler that determines background bandwidth allocations for the head node such that the background bandwidth of the head nodes is allocated in a way that the target replacement times determined by the translator are met.

For example, in some embodiments, each head node includes a store that stores mean time to failure statistics for different types of system components of a fault-tolerant data storage system, such as mean time to failure statistics for head nodes, data storage sleds, and/or mass storage devices of the data storage sleds. In some embodiments, mean time to failure statistics for the different system components may be generally known for the system components and stored as known values that are static or periodically updated. Also, in some embodiments, a fault-tolerant data storage system may actively monitor for system component failures and automatically update mean time to failure statistics for different types of system components, such that mean time to failure statistics used by a translator component of a head node to determine a target replacement time for lost redundantly stored data take into account currently occurring hardware anomalies or software bugs. Also, in some embodiments, a fault-tolerant data storage system may include an interface that enables an administrator, or other user, to provide information related to system component failures. For example, if there is a known software bug, an administrator may make adjustments to failure statistics stored in fault-tolerant data storage system via the interface, such that the known software bug is taken into account when determining target replacement times for redundantly stored lost data.

As another example, in some embodiments, each head node includes, or is configured to access, a directory of service level agreements with corresponding durability requirements for a plurality of service level agreements supported by the fault-tolerant data storage system. Additionally, the directory includes information associating different ones of the service level agreements with volumes/volume partitions stored by the head node. Thus, a head node of the fault-tolerant data storage system is able to determine respective durability requirements for respective volume partitions for which the head node stores volume data.

In some embodiments, a particular head node of a plurality of head nodes of a fault-tolerant data storage system may be designated as a primary head node for a volume partition and one or more other head nodes of the fault-tolerant data storage system may be designated as one or more secondary (or reserve) head nodes for the volume partition. The primary head node may store volume data for the volume partition, such as write data included with write requests directed to the volume partition and may cause the volume data, such as the write data, to be stored to one or more replicas stored by the one or more secondary head nodes. Additionally, the head node designated as the primary head node may cause accumulated volume data stored by the head node to be flushed to the data storage sleds in response to one or more flush triggers being met. The flushed volume data may be erasure encoded and stored across a plurality of different mass storage devices in a plurality of different data storage sleds of the fault-tolerant data storage system.

In some embodiments, receiving write requests, causing write data to be replicated to secondary head nodes, performing flush operations, responding to read requests, etc. may be performed by a head node designated as a primary head node for a volume partition using foreground bandwidth of the head node. For example, in some embodiments a service level agreement may guarantee a particular level of I/O performance such as up to a particular number of input/output operations per second (IOPs) for a volume. In order to meet these requirements, a portion of the bandwidth capacity of the head node to communicate with other head nodes and/or clients may be reserved by the head node as foreground bandwidth. The client represents instructions that enable a compute instance to connect to, and perform I/O operations at, a remote data volume (e.g., a data volume stored on a physically separate computing device accessed over a network). The client may be implemented on an offload card of a server that includes the processing units (e.g., CPUs or GPUs) of the compute instance.

In some embodiments, tasks such as re-mirroring replicas in response to a lost replica stored on a secondary head node, re-creating a portion of lost erasure encoded flushed data in response to a failure of a mass storage device of a data storage sled, creating snapshots of volume data, re-building volume data from previously stored snapshots, re-distributing volume data in response to a re-partitioning of a volume etc. may be background tasks that are performed using a separate pool of bandwidth of the head node for communicating with other head nodes, data storage sleds, or external systems. In some embodiments, in order to provide a high level of compliance with service level agreements, such as a guaranteed level of IOPs, foreground bandwidth and background bandwidth allocations may be allocated from separately maintained bandwidth pools of the head node. For example, background tasks may not be allowed to consume more than a fixed amount of bandwidth available to the head node such that the foreground bandwidth pool remains available to perform foreground tasks without being negatively impacted by background tasks. Also in some embodiments, multiple background bandwidth pools may be maintained by a head node. For example, in some embodiments, a first background bandwidth pool may be allocated for background tasks that require bandwidth for communications between head nodes and a second background bandwidth pool may be allocated for tasks that require bandwidth for communications between the head node and data storage sleds. In some embodiments, different ports of a head node and/or network paths in the fault-tolerant data storage system may be used for communications between head nodes as opposed to communications between a head node and the data storage sleds. Thus, different bandwidth pools may be maintained for these different communication paths.

In some embodiments, a head node may be designated as a primary head node for multiple volume partitions at the same time, including volumes with different service level agreements and different corresponding durability requirements. In some embodiments, the head node may allocate background bandwidth for tasks associated with the multiple volume partitions from common background bandwidth pools that are shared pools available for use to perform background tasks for the multiple volume partitions, such as a head node to head node background bandwidth pool and a head node to data storage sled background bandwidth pool. In some embodiments, a background bandwidth scheduler of a head node may allocate background bandwidth from such pools in order to perform background tasks for particular volume partitions, such as re-mirroring a lost replica or re-creating lost erasure encoded data, based on a target time for replacement determined by a translator component as described above. Thus, more background bandwidth may be allocated to tasks with shorter target times and/or greater volumes of data to be transferred than is allocated to tasks with longer target times and/or less data to be transferred. In this way, the background bandwidth scheduler may allocate background bandwidth such that the durability requirements of the service level agreements associated with the different volume partitions are met.

In some embodiments, if there is insufficient background bandwidth available to meet target times for concurrent background tasks, but there is excess foreground bandwidth, a scheduler of a head node may temporarily augment one or more background bandwidth pools with excess foreground bandwidth capacity, subject to revocation if the bandwidth is needed to perform foreground tasks. Also, in some embodiments, if there is insufficient background bandwidth to concurrently perform background tasks within determined target times, allocations of background bandwidth may be prioritized such that higher durability volume partition target times are met in favor of lower durability volume partition target times. Though in some embodiments, various allocation strategies may be used to ensure lower durability volume partitions are not starved of background bandwidth for performing background tasks.

In some embodiments, background bandwidth capacity of respective head nodes of a fault-tolerant data storage system may be taken into account when placing a volume partition in the fault-tolerant data storage system For example, a given volume partition with a high durability requirement may be placed on a head node with other volume partitions with lower durability requirements in order to allow for a greater amount of background bandwidth of the head node selected for placement to be allocated to the volume partition with the higher durability requirement. In some embodiments, placement decisions may also take into account foreground requirements of a volume partition, such as a IOPs guarantee of an SLA associated with the volume partition and/or a size of the volume partition. In some embodiments, placement may consider storage capacity, IOPs capacity and/or available background bandwidth capacity of respective head nodes when selecting a head node to designate as a primary head node for a volume partition. In some embodiments, different ones of these criteria may be weighted differently when placing a volume partition and/or other evaluation processes may be used to balance the different requirements of the volume being placed against the available capacities of the head nodes of the fault-tolerant data storage system.

Some data storage systems, such as storage area networks (SAN) may allow a server or a pair of servers to access a shared set of storage resources. However, such systems may be susceptible to significant losses in performance due to a server failure. Also, in such systems, data may be durably stored in storage devices of the SAN network, but not durably stored in the servers accessing the SAN network.

In order to provide high durability data storage and low latencies for accessing data, a data storage unit of a fault-tolerant data storage system may store data in local storages of head nodes that function as servers for the fault-tolerant data storage system, replicate the data to other head nodes of the data storage unit, and also store the data across multiple mass storage devices in multiple data storage sleds of the data storage unit. Thus, a fault-tolerant data storage system that includes a data storage unit may provide low latency input/output operations (IOPs) for data stored in a storage of a head node, while still providing data durability due to the data being replicated to other head nodes. Furthermore, the fault-tolerant data storage system may provide equivalent or higher durability for the data once the data is stored in multiple mass storage devices in different data storage sleds of the data storage unit. Thus, a fault-tolerant data storage system may provide high levels of data durability and low input/output operation latency for data stored in a storage of a head node and replicated to other head nodes and for data stored in multiple mass storage devices in different data storage sleds of the fault-tolerant data storage system.

In some embodiments, data may be initially stored in a storage of a head node and replicated to a storage of one, two, or more other head nodes, and may be asynchronously copied to multiple mass storage devices in different data storage sleds that form a RAID array (random array of independent disks) to store the data. In some embodiments, recently stored data or frequently accessed data may remain in a head node storage to allow for low latency access to the data. The data may then be copied to mass storage devices in data storage sleds of a data storage unit of the fault-tolerant data storage system after a certain amount of time has elapsed since the data was last accessed or stored. Relocating the data to the mass storage devices may maintain or increase a durability of the data as compared to the data being stored in a storage of a primary head node and being replicated to a storage of one, two, or more secondary/reserve head nodes. In some embodiments, other criteria may be used to determine when data stored in a storage of a head node is to be moved to mass storage devices of data storage sleds of a data storage unit. For example, data may be collected in a log of a head node and upon an amount of data being stored in the log exceeding a threshold amount, the data may be relocated to mass storage devices of data storage sleds of a data storage unit of the fault-tolerant data storage system.

In some embodiments, a data storage unit of a fault-tolerant data storage system may include multiple head nodes, multiple data storage sleds, and at least two networking devices. The data storage unit may further include connectors for coupling the data storage unit with at least two separate power sources. The data storage unit may also include at least two power distribution systems within the data storage unit to provide redundant power to the head nodes, the data storage sleds, and the networking devices of the data storage unit. Furthermore, the at least two networking devices of the data storage unit may implement at least two redundant networks within the data storage unit that enable communications between the head nodes of the data storage unit and the data storage sleds of the data storage unit. Furthermore, the at least two networking devices of the data storage unit may implement at least two redundant networks within the data storage unit that enable communications between the head nodes of the data storage unit and external clients of the data storage unit. In some embodiments, a data storage unit that includes redundant networks and redundant power may provide high reliability and data durability for data storage and access while storing data locally within devices mounted within a single rack.

In some embodiments, a data storage unit of a data storage system may include multiple head nodes that are assigned network addresses that are routable from devices external to the data storage unit. Thus, external clients may communicate directly with head nodes of a data storage unit without the communications being routed through a control plane of the fault-tolerant data storage system that is external to the data storage unit, such as a zonal control plane. Also, a fault-tolerant data storage system that includes multiple data storage units may implement a zonal control plane that assigns volumes or volume partitions to particular ones of the data storage units of the data storage system. Also, a zonal control plane may coordinate operations between data storage units, such as rebalancing loads by moving volumes between data storage units. However, a data storage unit may also implement a local control plane configured to perform fail over operations for head nodes and mass storage devices of data storage sleds of the data storage unit. A local control plane of a given head node may include a translator that determines target times for recreating lost redundantly stored volume data and a background bandwidth scheduler that allocates background bandwidth from reserved pools of reserved background bandwidth to perform tasks to re-create lost redundantly stored volume data. Because head nodes of a data storage unit may communicate directly with client devices and because a local control plane may manage fail over operations within a data storage unit, the data storage unit may operate autonomously without relying on a zonal control plane once a volume has been created on the data storage unit. Also, within a given head node, a requirements translator and background bandwidth scheduler may operate autonomously without relying on a local control plane of the data storage unit. In some embodiments, a local control plane of a data storage unit and/or a zonal control plane of a fault-tolerant data storage system comprising multiple data storage units may track failures of system components, such as head node failures and data storage sled failures, and may provide updated failure statistics to translators of respective head nodes for use in determining target times for recreating lost redundantly stored volume data.

The traffic and operations of the cloud provider network may broadly be subdivided into two categories in various embodiments: control plane operations carried over a logical control plane and data plane operations carried over a logical data plane. While the data plane represents the movement of user data through the distributed computing system, the control plane represents the movement of control signals through the distributed computing system. The control plane generally includes one or more control plane components distributed across and implemented by one or more control servers. Control plane traffic generally includes administrative operations, such as system configuration and management (e.g., resource placement, hardware capacity management, diagnostic monitoring, system state information). The data plane includes customer resources that are implemented on the cloud provider network (e.g., computing instances, containers, block storage volumes, databases, file storage). Data plane traffic generally includes non-administrative operations such as transferring customer data to and from the customer resources. Certain control plane components (e.g., tier one control plane components such as the control plane for a virtualized computing service) are typically implemented on a separate set of servers from the data plane servers, while other control plane components (e.g., tier two control plane components such as analytics services) may share the virtualized servers with the data plane, and control plane traffic and data plane traffic may be sent over separate/distinct networks.

In some embodiments, in order to prevent corruption of data stored in mass storage devices of a fault-tolerant data storage system, a control plane may interface with a sled controller of a data storage sled of the data storage system. The data storage sled may include multiple mass storage devices serviced by the sled controller. Also, portions of respective mass storage devices of a particular data storage sled may be reserved for a particular volume serviced by a particular head node functioning as a primary head node for the particular volume. In order to reserve the portions for the particular volume or a volume partition of the particular volume, a sled controller of a data storage sled may provide a token to a head node requesting to reserve the portions. Once the portions are reserved for the particular volume or volume partition by the head node acting as the primary head node, the head node while acting as a primary head node for the particular volume or volume partition, may provide the token to the sled controller along with a write request when writing new data to the portions. The sled controller may verify the token and determine the head node is authorized to write to the portions. Also, the sled controller may be configured to prevent writes from head nodes that are not authorized to write to the particular portions of the mass storage devices of the data storage sled that includes the sled controller. The sled controller may refuse to perform a write request based on being presented an invalid token or based on a token not being included with a write request.

In some embodiments, a control plane such as a local control plane or a zonal control plane of a fault-tolerant data storage system may issue unique sequence numbers to head nodes of the data storage system to indicate which head node is a primary head node for a particular volume or volume partition. A primary head node may present a sequence number issued from a control plane to respective ones of the sled controllers of respective ones of the data storage sleds to reserve, for a particular volume or volume partition, respective portions of mass storage devices serviced by the respective ones of the respective sled controllers. In response, the sled controllers may issue a token to the primary head node to be included with future write requests directed to the respective portions.

In order to facilitate a failover operation between a primary head node and a reserve head node of a set of reserve head nodes, a control plane may issue new credentials, e.g. a new sequence number, to a set of head nodes that includes a reserve head node assuming a role of primary head node for a volume or volume partition. Additionally, once a replacement reserve head node has been designated for the volume partition, the control plane may issue another new credential, e.g. a new sequence number. In some embodiments, each time a membership change occurs for a set of head nodes that implement a primary head node and a set of two or more reserve head nodes for a volume partition, a control plane may issue a new sequence number to the head nodes included in the set with the changed membership. In some embodiments, the newly issued sequence number may be used to perform a failover and to ensure writes replicated between the head nodes and written to the data storage sleds are the most current writes for the volume partition. For example, a newly assigned primary head node may present the credentials, e.g. new sequence number, to respective sled controllers to receive respective tokens that supersede tokens previously issued to a previous head node acting as a primary head node for a particular volume or volume partition that had data stored in portions of mass storage devices service by the sled controller. Thus, during a fail over event, a previous primary head node may be fenced off from portions of mass storage devices to prevent corruption of data stored on the mass storage devices during the failover event.

In some embodiments, a fault-tolerant data storage system may utilize the issuance of new credentials as part of a failover as a method of tracking failure statistics for system components of the fault-tolerant data storage system.

FIG. 1A illustrates a fault-tolerant data storage system including head nodes and data storage sleds, wherein the fault-tolerant data storage system stores volumes with different durability requirements, according to some embodiments.

Fault-tolerant data storage system 102 includes multiple head nodes, such as head nodes 120, 140, 160, and 180. In some embodiments a fault-tolerant data storage system may include more head nodes than illustrated in FIGS. 1A-1E. Also, fault-tolerant data storage system 102 includes data storage sleds 194, 196, and 198. Note that while only three data storage sleds are illustrated data storage system 102 may include more data storage sleds than shown in FIGS. 1A-1E. The head nodes are configured to store primary replicas of volume data for volume partitions for which the head nodes are designated as a primary head node and are also configured to store secondary or reserve replicas for volume partitions for which the head nodes are designated as secondary or reserve head nodes. In some embodiments, a volume partition with a first durability requirement may be stored using a primary replica and a single secondary replica, and for another volume partition with a different durability requirement, more than one secondary (e.g. reserve) replica may be stored by more than one additional head node, in addition to the head node that stores the primary replica of volume data for the volume partition. Also in some embodiments, various erasure encoding schemes may be used to store volume data that has been flushed from the head nodes to the data storage sleds. For example in some embodiments, the data storage sleds may store erasure encoded data using a 4 stripe and 2 parity portion scheme, a 5 stripe and 3 parity portion scheme, or any other suitable erasure encoding scheme. For example data storage sled 194 stores stripe 109A of flushed volume data for the high durability volume and a stripe 111A of flushed volume data for the standard durability volume. Also, data storage sled 196 stores stripe 109B of flushed volume data for the high durability volume and parity data 111P for the flushed volume data of the standard volume. Additionally, data storage sled 198 stores parity data 109P for the high durability volume and strip 111B for the high durability volume. Note that in some embodiments, other erasure encoding schemes may be used as described in more detail in FIGS. 10-11, such as 3 stripes and 2 parity portions, 4 stripes and 2 parity portions, 5 stripes and 3 parity portions, 6 stripes and 3 parity portions, etc.

For example, head node 120 stores primary replica 101A for a high durability volume, wherein primary replica 101A includes volume data 103A for the high durability volume. Head node 120 also stores a primary replica 105A for a standard durability volume, wherein the primary replica 105A includes volume data 107A for the standard durability volume. For example, in some embodiments, volume data 103A and volume data 107A may include write data for the respective volumes, where the write data has not yet been flushed to the data storage sleds 194, 196, and 198.

As another example, head node 140 stores a first secondary replica 101B for the high durability volume, wherein the first secondary replica 101B includes replicated volume data 103B (which includes the same writes as included in volume data 103A). Head node 140 also stores a secondary replica 105B for the standard durability volume, wherein the secondary replica 105B includes replicated volume data 107B (which includes the same writes as included in volume data 107A). Additionally, for the high durability volume, head node 160 stores a second secondary (e.g. reserve) replica 101C. The second secondary replica 101C also includes another replicated copy of the volume data, e.g. volume data 103C.

As illustrated in FIG. 1A, head node 180 does not yet store a primary or secondary replica for the high durability volume or the standard durability volume. Note that for ease of illustration, the fault-tolerant data storage system 102 is illustrates as storing two volume partitions, one for a high durability volume and one for a standard durability volume. However, in some embodiments, a fault-tolerant data storage system may store multiple volume partitions for multiple volumes having varying durability requirements, and may also store multiple volume partitions for volume having a common durability requirement. For example, fault-tolerant data storage system 102 may concurrently store multiple high durability volumes/volume partitions and may concurrently store multiple standard durability volumes/volume partitions. Additionally, each head node may store replicas for a mix of volume partitions comprising multiple replicas for volume partitions having different durability requirements.

Additionally, each of the head nodes includes, or has access to, a directory storing service level agreements supported by the fault-tolerant data storage system 102 and also including indicators indicating which service level agreement apply to which volumes/volume partitions for volumes and volume partitions stored in the fault-tolerant data storage system. In some embodiments, a fault-tolerant data storage system may support a fixed number of different service level agreements, or in other embodiments, may enable a customer to specify particular requirements to be included in a service level agreement, such as a durability guarantee for data stored in the fault-tolerant data storage system. For example, head node 120 includes volume service level agreement directory 122, head node 140 includes volume service level agreement directory 142, head node 160 includes volume service level agreement directory 162, and head node 180 includes volume service level agreement directory 182. Note that in some embodiments, head nodes 120, 140, 160, and 180 may alternatively share a common volume service level agreement directory instead of each storing a separate volume service level agreement directory as shown in FIGS. 1A-1E.

Also, each of the head nodes includes, or has access to, an information store storing system component failure information, such as failure information for head nodes of the fault-tolerant data storage system and failure information for mass storage devices/sleds of the fault-tolerant data storage system. In some embodiments, the failure information may include mean time to failure statistics for different components of the fault-tolerant data storage system. In some embodiments, a time to failure may be measured from a time at which a components was made available to store volume data to a time at which a failure of the component was detected, such as a failure that triggers a re-mirroring operation or a re-creation of erasure encoded flushed data. In some embodiments, a mean time to failure may use a sample size for determining the mean that includes all similar components in a fault-tolerant data storage system, such as all head nodes of the fault-tolerant data storage system, or may use other sample sizes, such as based on region, data center, equipment manufacturer, equipment age, software used, service conditions, etc. Thus, in some embodiments, mean time to failure statistics may be generic across a fault-tolerant data storage system for similar types of system components or may be customized for system components having distinct characteristics that affect failure rates.

In some embodiments, each head node may maintain, or have access to, a separate information store for failure statistics relevant to system components with which the head node interacts, e.g. other head nodes in the same data storage unit, mass storage devices of sleds in the same data storage unit, and/or sleds/sled controllers of sleds in the same data storage unit. Also, in some embodiments, one or more head nodes may share an information store. For example, in some embodiments a single information store for failure statistics may be maintained and shared by a set of head nodes in a data storage unit.

As shown in FIGS. 1A-1E head node 120 includes system component mean time to failure store 124, head node 140 includes system component mean time to failure store 144, head node 160 includes system component mean time to failure store 164, and head node 180 includes system component mean time to failure store 184.

Additionally, each head node includes a translator that determines target times for recovering redundantly stored lost data in response to a loss of a replica stored by a head node or a loss of a portion of erasure encoded flushed volume data stored by a mass storage device of a data storage sled. The translator may take a durability requirement of a service level agreement, such as from the volume service level agreement directory and also take as an input a system component failure statistic, such as from the system component time to failure information store and use these inputs to determine an output that indicates a target time for restoring the lost replica or the lost portion of the erasure encoded data. The target time may be determined based on the durability requirement and the failure statistics such that a durability guarantee is met.

For example, if a durability requirement is that volume data is 99.99999 (e.g. 5-9 s) durable and a mean time to failure of system components still in use to store volume data for the volume partition indicate a probability that another one of the system components, such as another head node or another data storage sled, may fail with a particular probability of occurrence, a statistical calculation may be performed to determine a target amount of time based on the failure statistics, wherein the target time is selected such that the probability of failure of an additional system component, or failure of multiple additional system components, in the target amount time is sufficiently low that the durability requirement is met. Note that the durability requirement may guarantee that volume data is not lost. Thus, for a high durability volume that is stored using multiple secondary replicas, it may require both secondary replicas and a primary replica to be lost in order for volume data to be lost. While, for a standard durability volume that is stored using a primary replica and a single secondary replica, a failure of the primary replica or the secondary replica may leave the fault-tolerant data storage system exposed to volume data loss if a component storing the remaining replica fails before re-mirroring to a replacement replica is completed. Thus, another consideration used by the translator that determines target times for recovery may be a number of replicas stored for the volume partition, or a type of erasure encoding scheme used to store erasure encoded volume data, where some erasure encoding schemes can tolerate more failures than others without losing volume data.

Note that for simplicity two volume durability types are discussed. However, in some embodiments more volume durability types may be supported by a fault-tolerant data storage system. For example, multiple volume durability types may be supported for volumes that are stored using only a primary replica and a secondary replica stored in the head nodes of a fault-tolerant data storage system. Also, multiple durability types may be supported for volume types that are stored using two or more secondary replicas store in the head nodes of the fault-tolerant data storage system. For volume types storing a same number of replicas in the head nodes, but having different durability guarantees, the durability guarantees may be met by reducing an amount of time the volume partition is allowed to be stored with less than a full complement of replicas. For example, for an upgraded durability volume type that is stored only using a primary replica and a secondary replica stored in the head nodes, an amount of time the volume is permitted to remain with a solo replica may be controlled to enforce the durability guarantee. This may be done by the translator that determines the target time for recovery of a lost replica for the volume partition. For example the translator may determine a target time to recovery that reduce the amount of time the volume remains "solo" to an acceptable probability of additional failure in line with the durability guarantee. Note that while the examples above have been described in terms of replicas stored by head nodes, similar considerations may be taken into account when determining a target time to re-create flushed volume data for portions of erasure encoded volume data lost due to a failure in relation to the data storage sleds.

For example, head node 120 includes translator for target time to recover 126, head node 140 includes translator for target time to recover 146, head node 160 includes translator for target time to recover 166, and head node 180 includes translator for target time to recover 186.

Also, each head node includes a background bandwidth scheduler that allocates background bandwidth from a first background bandwidth pool for communications between the head node and other head nodes of the fault-tolerant data storage system and a second background bandwidth pool for communications between the head node and data storage sleds of the fault-tolerant data storage system. The background bandwidth scheduler may receive a target time for recovery from the translator and may determine based on the target time to recover and a volume of data to be transmitted to perform the recovery, an amount of background bandwidth to allocate to perform recovery tasks such that the redundantly stored lost volume data (e.g. lost replica or lost erasure encoded flushed data) is re-created within the target time. As discussed above, because different ports and/or different network paths within a data storage unit may be used for communications between the head node and other head nodes and for communications between the head node and data storage sleds, different pools of background bandwidth may be maintained. Note that a given head node may utilize a common pool of background bandwidth, such as between the head node and other head nodes, for allocating background bandwidth to all volume partitions stored by the head node. Thus, allocations must be managed such that a re-mirroring of a first replica for a first volume partition stored by the head node does not deprive a re-mirroring task for another replica of another volume partition stored by the head node from being able to be completed within a determined target time.

For example, head node 120 includes background bandwidth scheduler 128 that allocates background bandwidth from head node communications bandwidth pool 130 and data storage sled communications pool 132. Also, head node 140 includes background bandwidth scheduler 148 that allocates background bandwidth from head node communications bandwidth pool 150 and data storage sled communications pool 152. Head node 160 includes background bandwidth scheduler 168 that allocates background bandwidth from head node communications bandwidth pool 170 and data storage sled communications pool 172. Additionally, head node 180 includes background bandwidth scheduler 188 that allocates background bandwidth from head node communications bandwidth pool 190 and data storage sled communications pool 192.

Figure 1B:
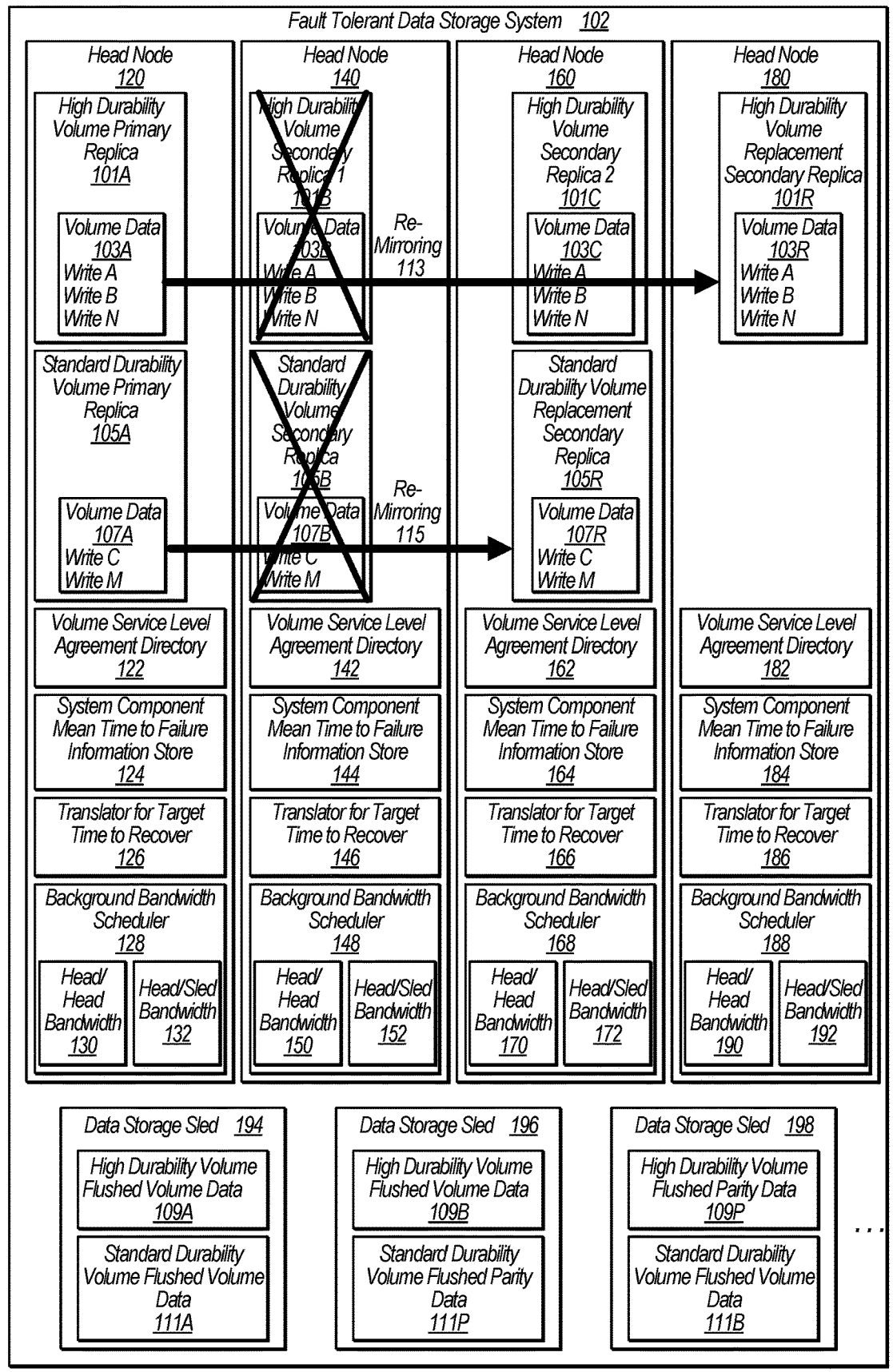
FIG. 1B illustrates a head node of the fault-tolerant data storage system re-mirroring replicas of volume partitions to create replacement secondary replicas for the volume partitions in response to a loss of a head node storing secondary replicas for the volume partitions, wherein the head node prioritizes allocations of background bandwidth to perform the re-mirroring based on the different durability requirements of the volumes of which the volume partitions are a part, according to some embodiments.

FIG. 1B illustrates a head node of the fault-tolerant data storage system re-mirroring replicas of volume partitions to create replacement secondary replicas for the volume partitions in response to a loss of a head node storing secondary replicas for the volume partitions, wherein the head node prioritizes allocations of background bandwidth to perform the re-mirroring based on the different durability requirements of the volumes of which the volume partitions are a part, according to some embodiments.

For various reasons, such as hardware failures, software bugs, power failures, etc. a head node of a fault-tolerant data storage system may become unavailable and/or replicas stored on a head node of a fault-tolerant data storage system may become corrupted or otherwise unavailable. For example in FIG. 1B secondary replica 101B of the high durability volume partition and secondary replica 105B of the standard durability volume partition are lost. In response to the loss of a replica stored in a head node, a fault-tolerant storage system, such as fault-tolerant data storage system 102, may cause a remaining replicas stored on another head node, such as primary replica 101A of the high durability volume partition and primary replica 105A of the standard durability volume partition, to be re-mirrored to another head node to create a new replacement secondary replica. For example, re-mirroring 113 re-mirrors volume data 103A of primary replica 101A to create replacement secondary replica 101R stored on head node 180, which includes replicated volume data 103R. Also, re-mirroring 115 re-mirrors volume data 107A of primary replica 105A to replacement secondary replica 105R stored on head node 160, which includes replicated data 107R.

Figure 1C:
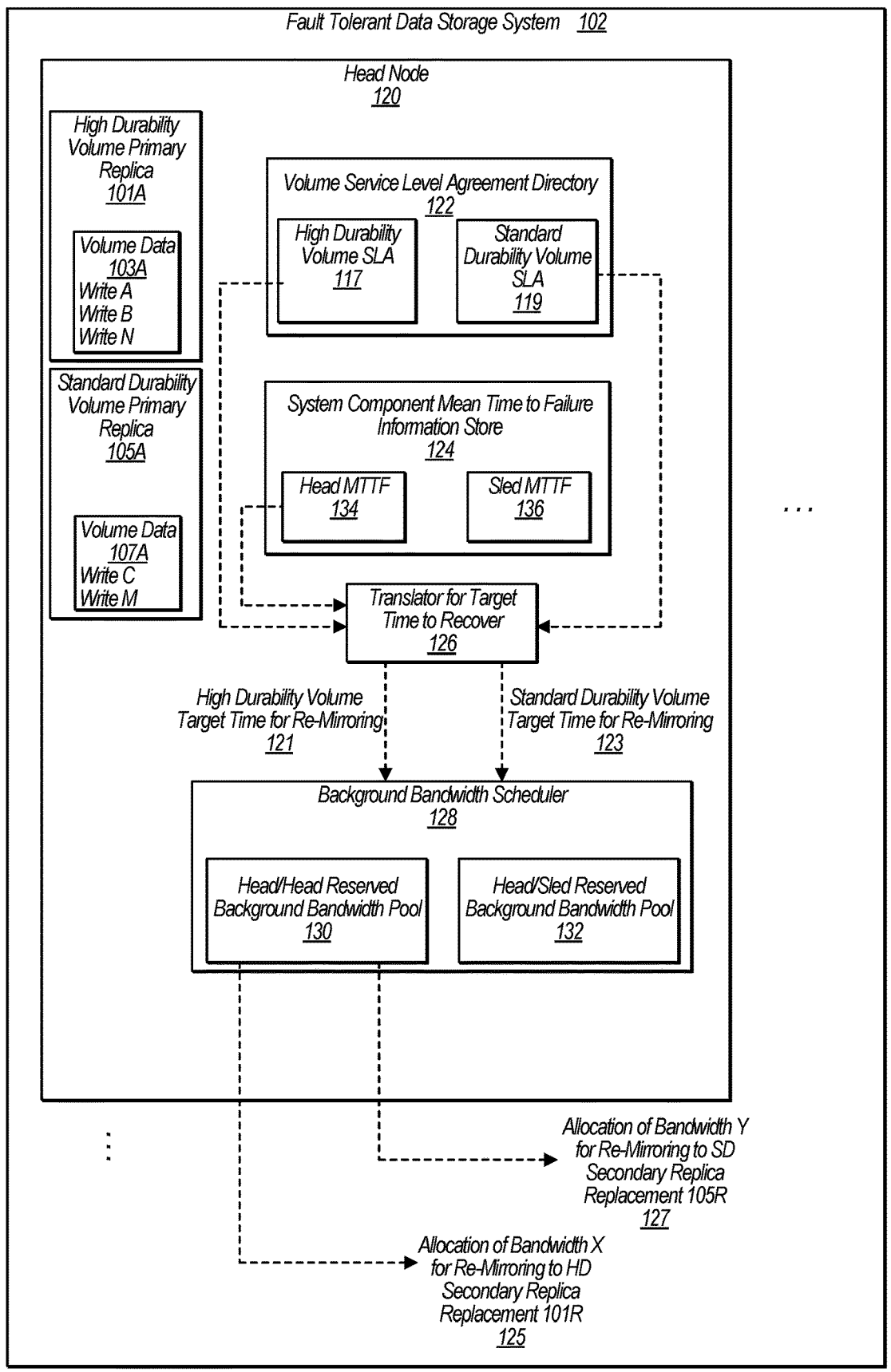
FIG. 1C illustrates a more detailed view of the head node allocating background bandwidth to perform the re-mirroring of the replicas, according to some embodiments.

FIG. 1C illustrates a more detailed view of the head node allocating background bandwidth to perform the re-mirroring of the replicas, according to some embodiments.

As shown in FIG. 1C, durability requirements 117 for the high durability volume and durability requirements 119 for the standard durability volume may be provided to the translator 126 that determines a target time for completion of re-mirroring 113 and re-mirroring 115. Additionally, head node mean time to failure (MTTF) statistics 134 stored in information store 124 are provided to the translator 126 of the head node 120 that stores the primary replica of the high durability volume partition and the primary replica of the standard durability volume partition. As described above, respective target times for completion of the respective re-mirroring tasks may be determined based on the mean time to failure statistics for the type of storage system component involved, such as mean time to failure statistics 134 for the head nodes 120, 140, 160, 180, etc. and the durability requirements included in service level agreements (SLAs) for the respective volumes (e.g. SLAs 117 and 119). For example the high-durability volume partition may be associated with a service level agreement that guarantees a 99.99999% durability level (e.g. 5-9s durability), whereas the standard durability volume partition may be associated with a service level agreement that guarantees a 99.999% durability level (e.g. 3-9s durability). Since both volume partitions are being re-mirrored to head nodes, the head node MTTF statistics may be similar. However since the volume partitions have different durability requirements, the translator 126 may determine a shorter duration target time for the re-mirroring 113 to re-mirror the volume data 103A of the high durability volume partition to replacement secondary replica 101R, as compared to a longer duration target time for the re-mirroring 115 to re-mirror the volume data 107A of the standard durability volume partition to replacement secondary replica 105R. For example, target time 121 may provide a shorter amount of time to complete re-mirroring 113 than is provided by target time 123 for completing the re-mirroring 115.

Assuming replica 101A and replica 105A comprise similar amounts of data (e.g. volume data 103A and 107A) that needs to be re-mirrored, the background bandwidth scheduler 128 may allocate more background bandwidth in allocation 125 to perform the re-mirroring 113 than an amount of background bandwidth allocated in allocation 127 to perform the re-mirroring 115. However, in some instances background bandwidth allocations may further be adjusted based on an amount of volume data that needs to be re-mirrored. For example, if standard durability replica 105A includes considerably more volume data 107A than high durability volume replica 101A includes of volume data 103A, there may be occurrences in which the standard durability volume replica is allocated more bandwidth for re-mirroring than the high durability volume replica. However, in such circumstances the background bandwidth may be allocated such that both replicas are re-mirrored within the respective target times for re-mirroring as determined by the translator 126.

In some circumstances wherein multiple re-mirroring jobs are to be performed concurrently conflicts between re-mirroring tasks for a limited pool of reserved background bandwidth may be resolved in favor of re-mirroring tasks for volume partitions with greater durability requirements. For example, if multiple large replicas need to be concurrently re-mirrored and bandwidth requirements to complete the re-mirroring tasks exceed an amount of reserved background bandwidth in head/head reserved background bandwidth pool 130, the background bandwidth scheduler 128 may preferentially allocate bandwidth to a re-mirroring task for a replica of a volume partition for a volume with a greater durability guarantee. Also as mentioned above, for volume partitions that are stored with more than one secondary replica (e.g. two or more secondary replicas) this may be a factor taken into account by translator 126 when determining a target time for re-mirroring. For example, for a volume partition wherein a replica fails but two replicas remain available it may be in less danger of losing volume data than a volume partition wherein one replica has failed and only one replica remains available, or a volume partition wherein multiple replicas have failed and only one replica remains available. Thus in some circumstances, a higher durability volume with multiple remaining replicas may be assigned a longer target time than a lower durability volume without a remaining secondary replica available.

Also, as mentioned above, in some embodiments, if head node communications reserved background bandwidth pool 130 is exhausted, but there is currently excess foreground bandwidth, background bandwidth pool 130 may be temporarily augmented by re-allocating excess foreground bandwidth to the background bandwidth pool 130.

Figure 1D:
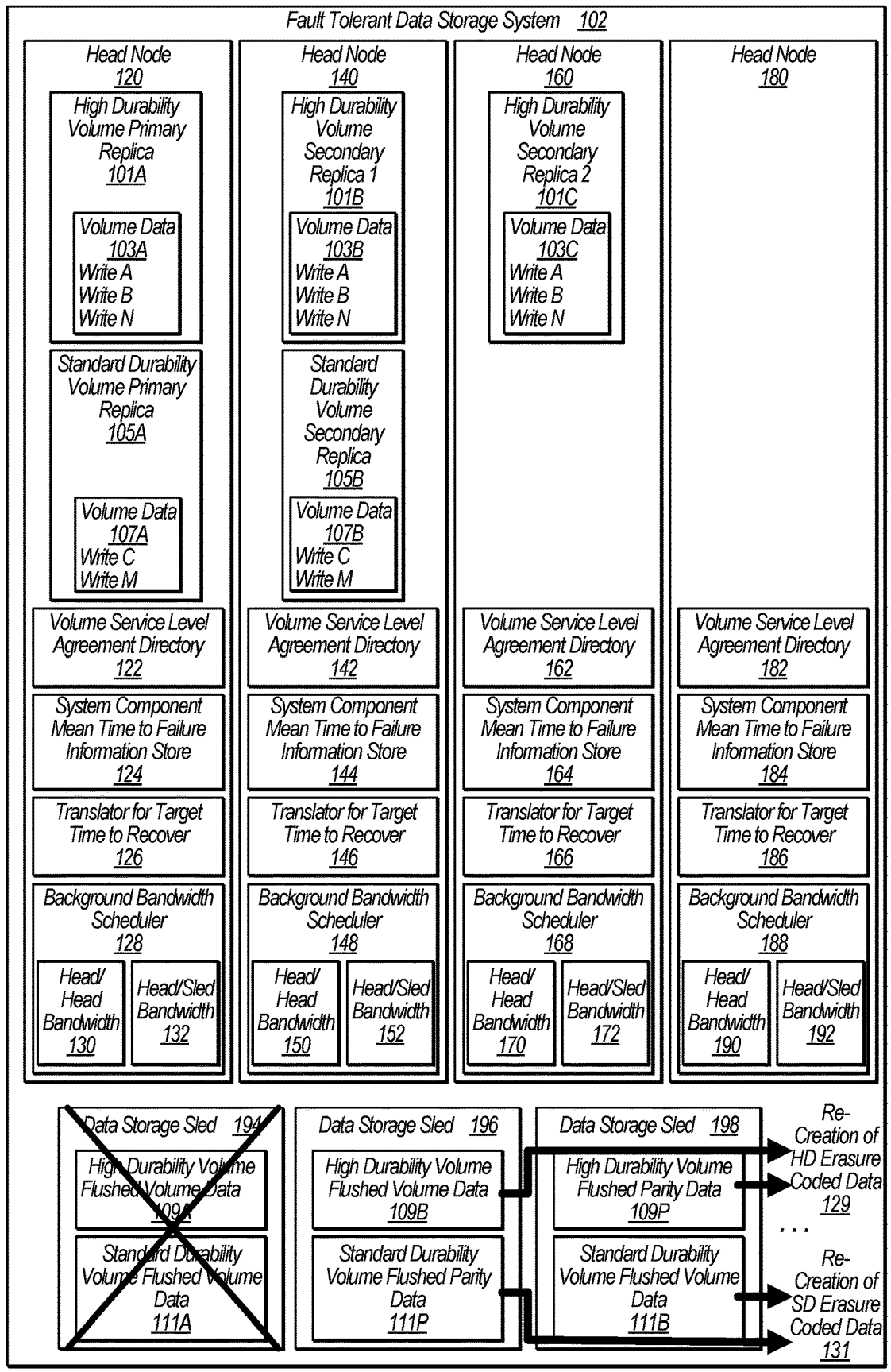
FIG. 1D illustrates, a head node of the fault-tolerant data storage system re-creating erasure encoded volume data for the volume partitions of the volumes with different durability requirements in response to a loss of a data storage sled that stored erasure encoded volume data for the volume partitions, wherein the head node prioritizes allocations of background bandwidth to re-create the lost volume data based on the different durability requirements of the volumes of which the volume partitions are a part, according to some embodiments.

FIG. 1D illustrates, a head node of the fault-tolerant data storage system re-creating erasure encoded volume data for the volume partitions of the volumes with different durability requirements in response to a loss of a data storage sled that stored erasure encoded volume data for the volume partitions, wherein the head node prioritizes allocations of background bandwidth to re-create the lost volume data based on the different durability requirements of the volumes of which the volume partitions are a part, according to some embodiments.

Also, in some circumstances, a data storage sled, or a mass storage device of a data storage sled may fail, become corrupted, or otherwise become unavailable. In response to a loss of erasure encoded volume data stored on mass storage devices of data storage sleds of a fault-tolerant data storage system, the fault-tolerant data storage system may cause the lost volume data/erasure encoded volume data to be re-created, erasure encoded, and stored on a different mass storage device of another data storage sleds of the fault-tolerant data storage system. For example, in FIG. 1D data storage sled 194 is lost. This data storage sled stored a strip of flushed volume data 109A for the high durability volume partition and a stripe of flushed volume data 111A for the standard durability volume partition. As shown in FIG. 1D, other ones of the data storage sleds store other stripes of volume data for the respective volume partitions and parity data for the erasure encoded stripes of volume data. Though, only three data storage sleds are shown in FIGS. 1A-1E, in some embodiments, 6 or more data storage sleds may store flushed volume data for a given volume partition, with four data storage sleds storing stripes of the volume data and two data storage sleds storing parity data. In such systems, if two of the six portions are lost, the lost erasure encoded data can be re-created from the remaining portions. For example, if a stripe of volume data is lost, and a parity portion is lost, the lost strip can be-recreated using the remaining parity portion and the remaining stripes, then the lost parity portion can be re-created using the three original stripes and the one re-created stripe. Thus, in a 4:2 erasure encoding scheme two failures can be tolerated without losing volume data. In some embodiments, other erasure encoding schemes may be used as described in FIGS. 11A-11D.

For example, FIG. 1D illustrates stripe 109B and parity portion 109P being used to perform data recreation 129 for the erasure encoded flushed volume data of the high durability volume partition. Also, FIG. 1D illustrates 111B and parity portion 111P being used to perform data recreation 131 for the erasure encoded flushed volume data of the standard durability volume partition.

Figure 1E:
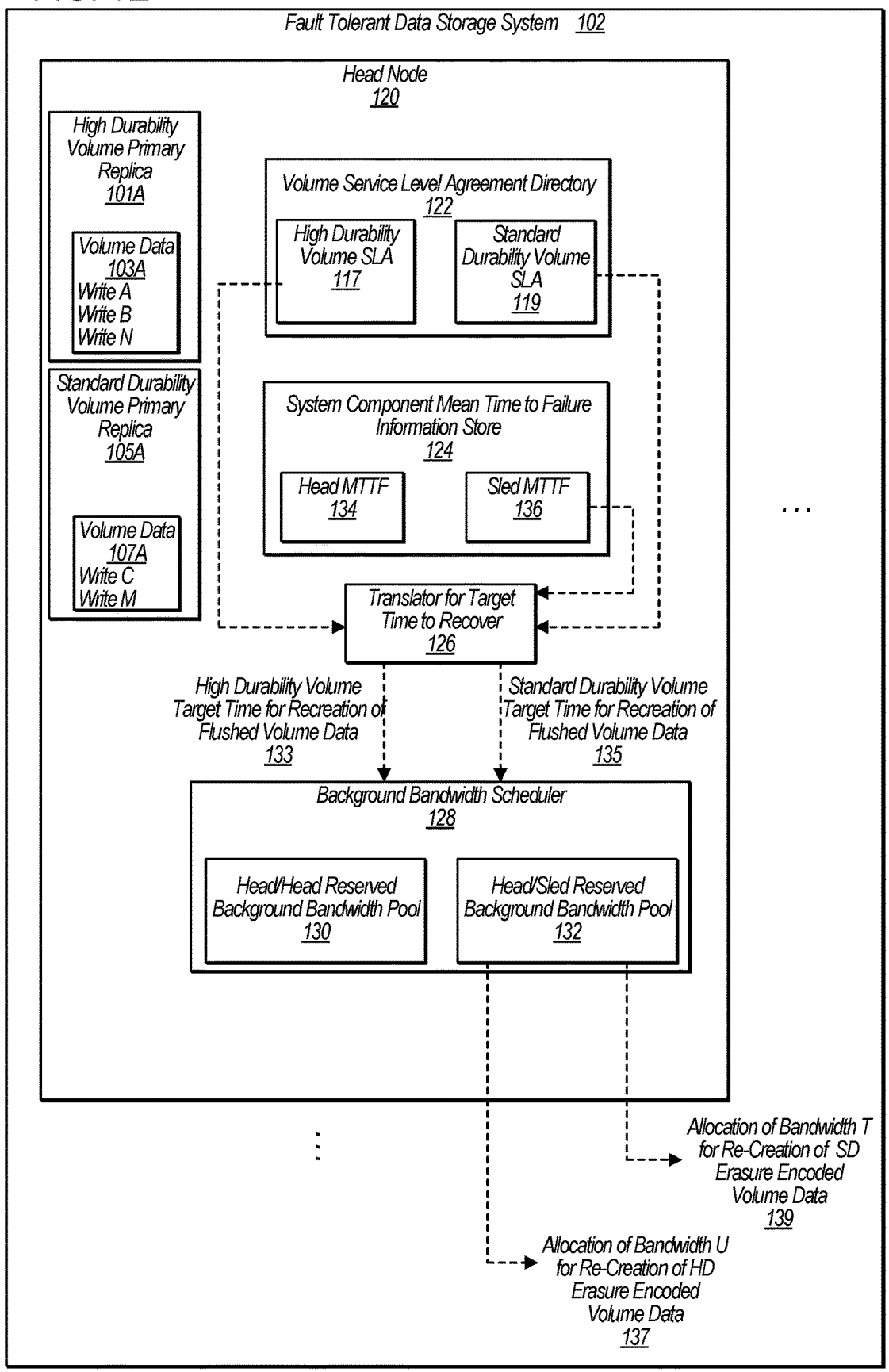
FIG. 1E illustrates a more detailed view of the head node allocating background bandwidth to perform the re-creation of the erasure encoded volume data, according to some embodiments.

FIG. 1E illustrates a more detailed view of the head node allocating background bandwidth to perform the re-creation of the erasure encoded volume data, according to some embodiments.

In a similar manner as described for FIG. 1C, translator 126 receives durability requirements 117 and 119. Also, translator 126 receives data storage sled mean time to failure statistics 136. Based on these inputs, translator 126 determines target time 133 for recreation of the erasure encoded volume data for the high durability volume partition and determines target time 135 for recreation of the erasure encoded volume data for the standard durability volume partition.

Also in s similar manner as described in FIG. 1C, background bandwidth scheduler 128 determines background bandwidth allocation 137 for performing tasks to re-create the erasure encoded volume data for the high durability volume partition and determines background bandwidth allocation 139 for performing tasks to re-create the erasure encoded volume data for the standard durability volume partition.

Figure 2:
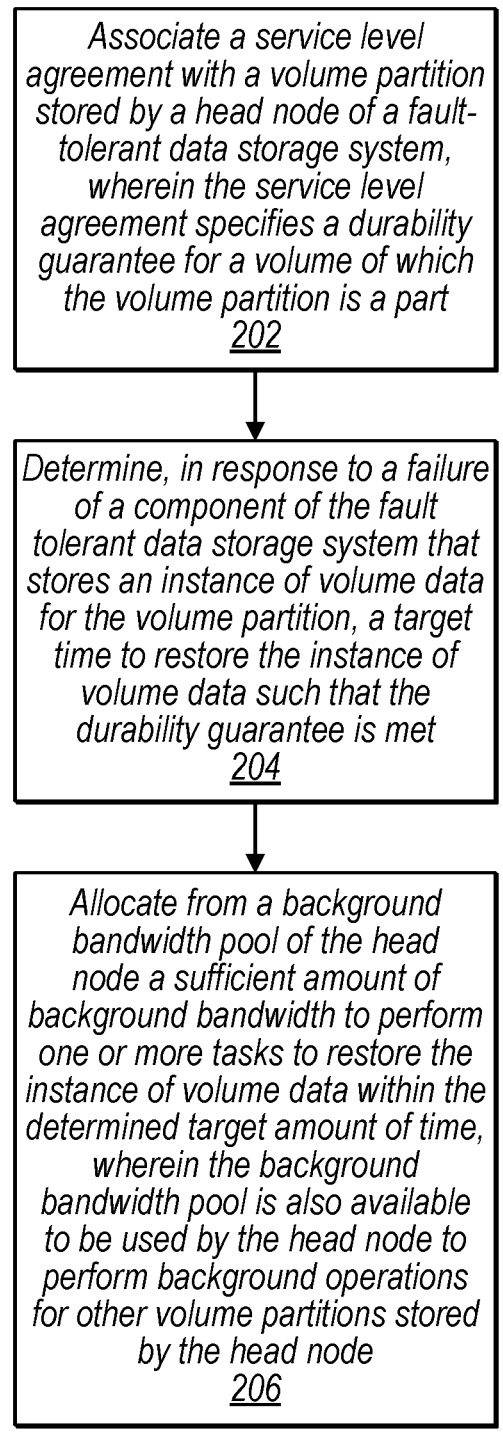
FIG. 2 illustrates a process for managing resources of a head node of a fault-tolerant data storage system to provide different levels of durability for volume partitions with different durability requirements that are stored in the fault-tolerant data storage system, according to some embodiments.

FIG. 2 illustrates a process for managing resources of a head node of a fault-tolerant data storage system to provide different levels of durability for volume partitions with different durability requirements that are stored in the fault-tolerant data storage system, according to some embodiments.

At 202, a control plane of a head node, associates a service level agreement with a volume partition stored by the head node. For example, such an association may be stored in a volume service level agreement directory or may be determined based on accessing a volume service level agreement directory. The respective service level agreements associated with respective volumes/volume partitions may specify durability requirements for the volumes/volume partitions.

At 204, the control plane of the head node, such as a translator for target time to recover module of a control plane of the head node, determines, in response to the failure of a component of the fault-tolerant data storage system, a target time to restore the instance of volume data such that the durability guarantee is met.

At 206, the control plane of the head node, such as a background bandwidth scheduler module of a control plane of a head node, allocates background bandwidth from a reserved background bandwidth pool for performing one or more tasks to restore the instance of volume data within the determined target amount of time, wherein the background bandwidth pool is also available to be used by the head node to perform background operations for other volume partitions stored by the head node.

Figure 3A:
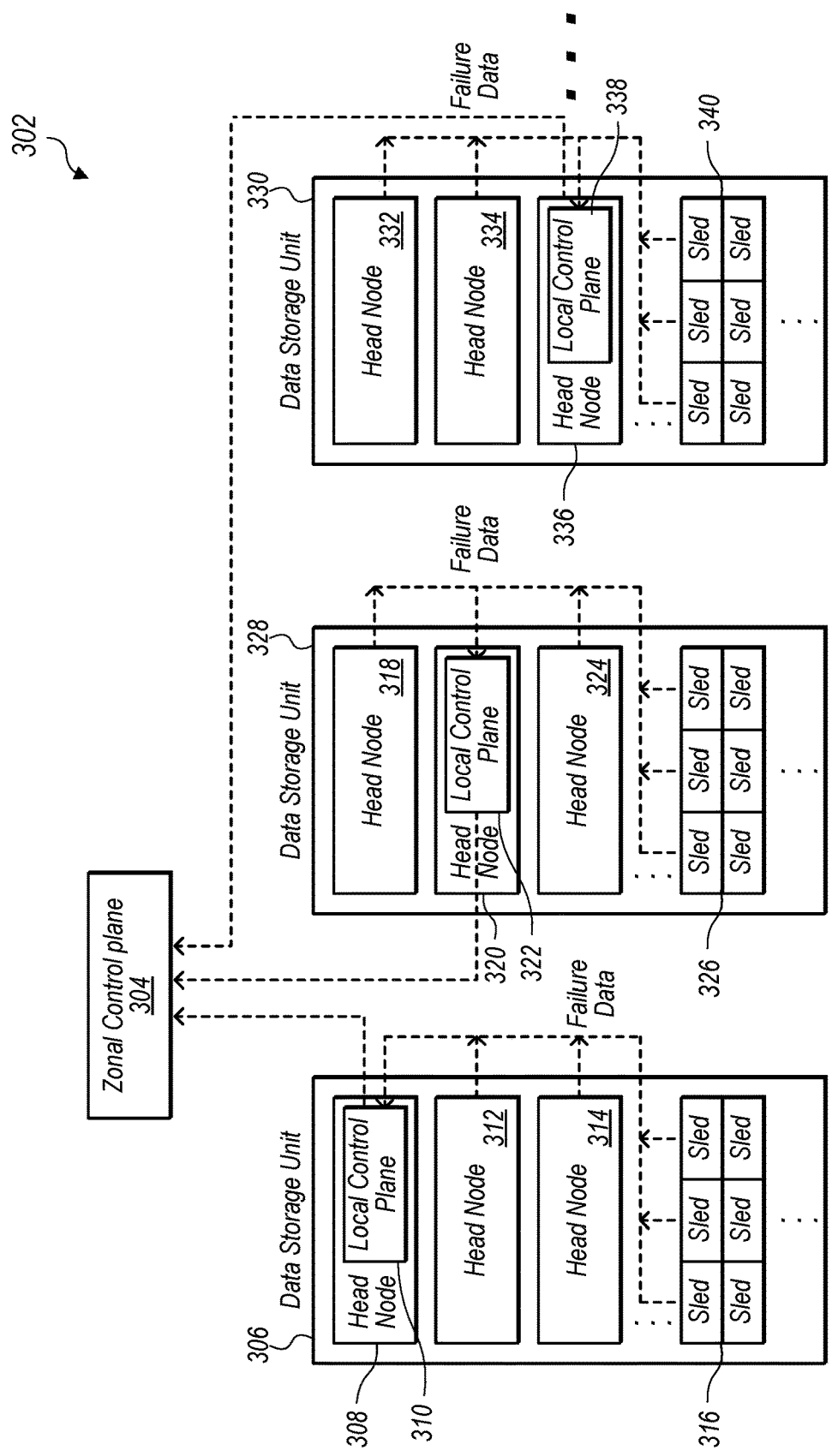
FIG. 3A illustrates failure information being collected from head nodes and/or data storage sleds in a fault-tolerant data storage system, according to some embodiments.

FIG. 3A illustrates failure information being collected from head nodes and/or data storage sleds in a fault-tolerant data storage system, according to some embodiments.

In some embodiments, a fault-tolerant data storage system, such as fault-tolerant data storage system 102 illustrated in FIGS. 1A-1E may include one or more data storage units. For example, fault-tolerant data storage system 302 includes data storage units 306, 328, and 330. In some embodiments, a fault-tolerant data storage system, such as fault-tolerant data storage system 302, may further include a zonal control plane, such as zonal control plane 304. In some embodiments, data storage sleds and head nodes of a data storage unit may report failure to a local control plane implemented on a head node of a data storage unit, and the local control planes may report failure and/or failure statistics up to the zonal control plane. These reported failure statistics may be used to update mean time to failure information stored for head nodes and data storage sleds of a fault-tolerant data storage system. For example, head node mean time to failure statistics 134 and data storage sled failure statistics 136 may be automatically updated based on failures reported to a local control plane and/or zonal control plane. Also, in some embodiments, failure information may be communicated down to head nodes from a zonal or local control plane, wherein the failure statistics are received from an administrator or other user via a user interface to the fault-tolerant data storage system.

For example, in FIG. 3A, sleds 316 report failure information up to local control plane 310 for data storage unit 306. Also, head nodes 308, 312, and 314 report failure information up to local control plane 310. Likewise for data storage unit 328, sleds 326 report failure information up to local control plane 322. Also, head nodes 318, 320, and 324 report failure information up to local control plane 322. In a similar manner, sleds 340 of data storage unit 330 report failure information up to local control plane 338. Likewise head nodes 332, 334, and 336 report failure information up to local control plane 338. In some embodiments, each local control plane may maintain its own mean time to failure statistics based on the failure information reported up. Also, in some embodiments, each local control plane 310, 322, and 338 may further report failure information up to zonal control plane 304, which may determine mean time to failure statistics based on failures across multiple data storage units. In some embodiments, mean time to failure statistics may be directed to particular grounds of system components, such as head nodes or data storage sleds. Also, in some embodiments, mean time to failure statistics may be maintained at a more granular level, such as per computer room of a data center, per data center, per region of data centers, etc. In some embodiments, different sets of mean time to failure statistics may be maintained for other more granular groupings of system components, such as head nodes manufactured by a particular manufacturer, or head nodes running a particular software version, etc. Similarly mean time to failure statistics may be maintained for data storage sleds at different levels of granularity.

Figure 3B:
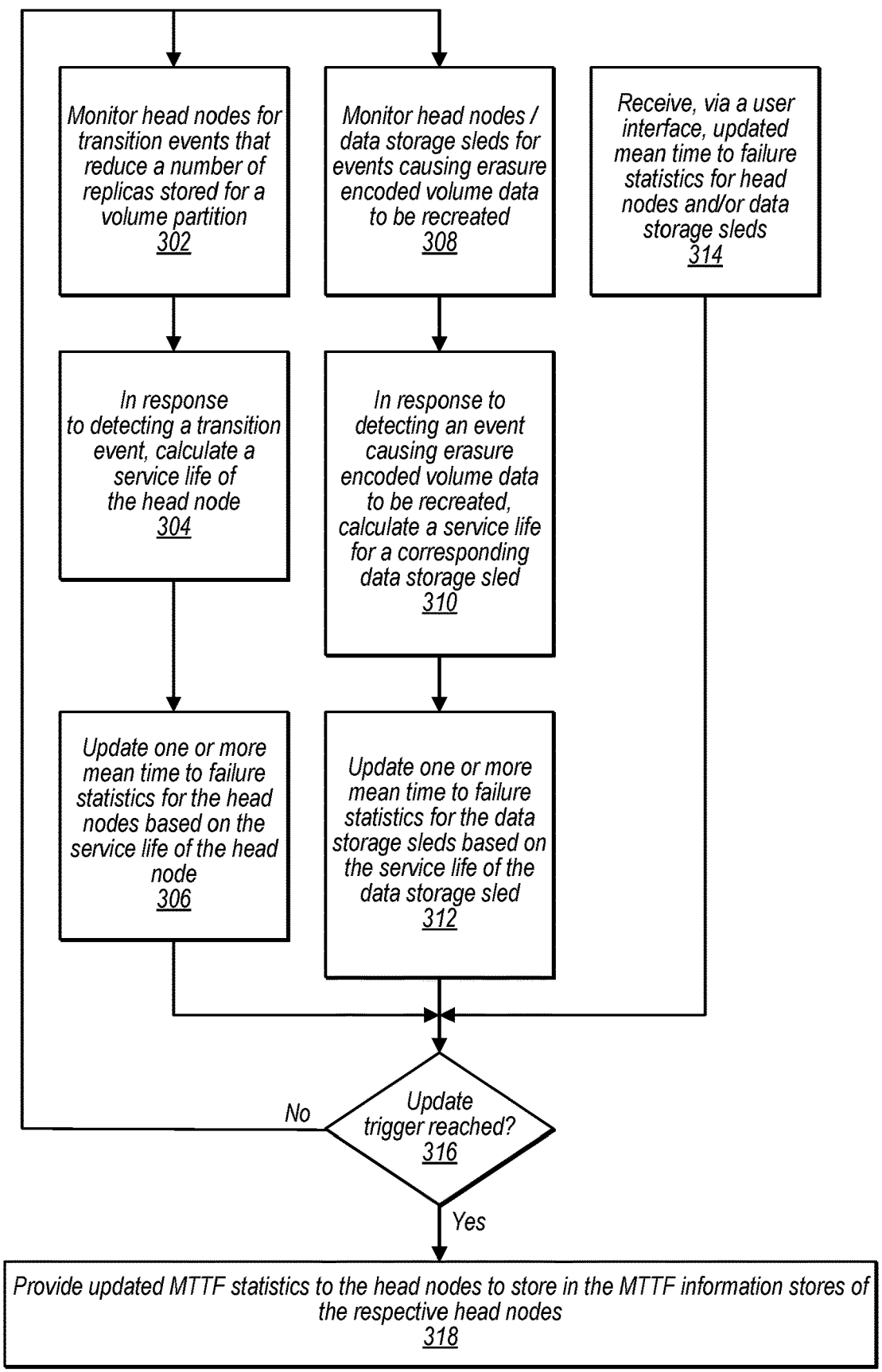
FIG. 3B illustrates a process for updating failure statistics used by head nodes of a fault-tolerant data storage system to determine target times for re-creating volume data in response to a loss of volume data such that durability requirements of volumes stored in the fault-tolerant data storage system are met, according to some embodiments.

FIG. 3B illustrates a process for updating failure statistics used by head nodes of a fault-tolerant data storage system to determine target times for re-creating volume data in response to a loss of volume data such that durability requirements of volumes stored in the fault-tolerant data storage system are met, according to some embodiments.

At 302, a fault-tolerant data storage system monitors head nodes for transitions events that reduce a number of replicas stored for a volume partition, such as a transition from having two reserve replicas and a primary replica to only having a single reserve (e.g. secondary) replica and a primary replica. Or, a transition from having a primary replica and a secondary replica to being reduced to a solo replica.

At 304, in response to detecting a transition event, the fault-tolerant data storage system calculates a service life of the recently failed head node.

At 306, the fault-tolerant data storage system updates one or more mean time to failure statistics for the head nodes based on the calculated service life of the recently failed head node.

In a similar manner, at 308, the fault-tolerant data storage system monitors head nodes/data storage sleds for events causing erasure encoded volume data to be re-created. For example, in some embodiments, a fault-tolerant data storage system may use the initiation of a process of re-creating erasure encoded data that is executed by a head node as a trigger for identifying the occurrence of a failure of a data storage sled and/or a mass storage device of a data storage sled.

At 310, in response to detecting an event causing erasure encoded volume data to be re-created, the fault-tolerant data storage system calculates a service life of the recently failed data storage sled/mass storage device.

At 312, the fault-tolerant data storage system updates one or more mean time to failure statistics for the data storage sleds/mass storage devices based on the calculated service life of the recently failed data storage sled/mass storage device.

Alternatively or additionally, at 314, the fault-tolerant data storage system receives, via a user interface, updated mean time to failure statistics for the head nodes and/or data storage sleds/mass storage devices. For example, in some embodiments an operator of the fault-tolerant data storage system may determine a particular reliability issue with a particular type or model of system component or software and may manually enter or adjust mean time to failure statistics based on the known issue.

As discussed in FIG. 3A, in some embodiments, mean time to failure information may be reported up to a local or zonal control plane of the fault-tolerant data storage system. In such embodiments, the local or zonal control plane may provide updated mean time to failure statistics to the head nodes at 318 in response to an update trigger being reached at 316. For example, in some embodiments the update trigger may be time based, such as every five minutes, every hour, every day, every weak, etc. Also, in some embodiments, the update trigger may be based on deviation. For example, if the currently calculated mean time to failure statistics of the control plane deviate from the last issued mean time to failure statistics sent to the head nodes, then an update may be triggered.

Figure 4A:
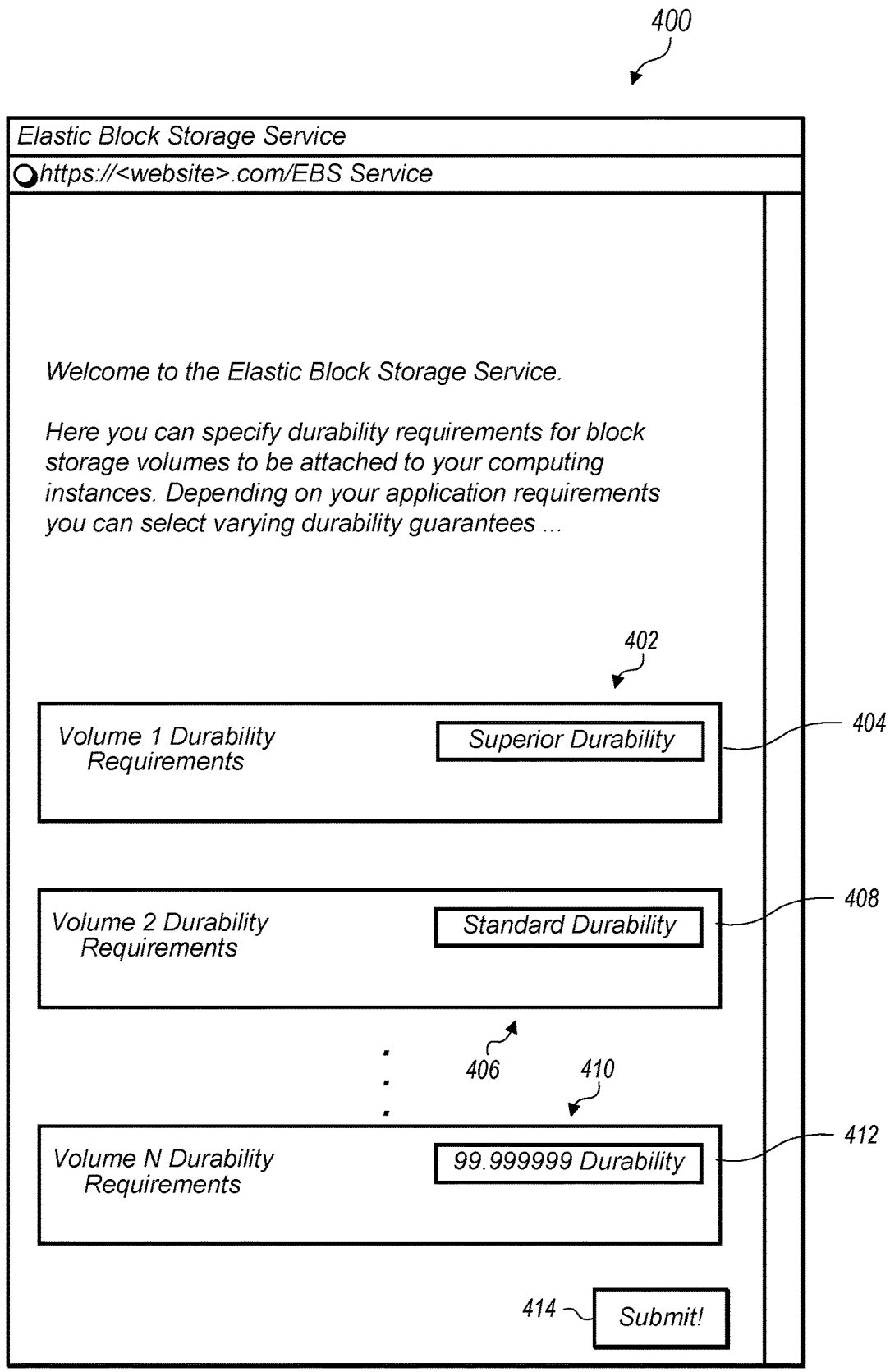
FIG. 4A illustrates an example user interface that may be provided to a customer of a fault-tolerant data storage system in order to select a durability requirement for a volume stored, or to be stored, in the fault-tolerant data storage system, according to some embodiments.

FIG. 4A illustrates an example user interface that may be provided to a customer of a fault-tolerant data storage system in order to select a durability requirement for a volume stored, or to be stored, in the fault-tolerant data storage system, according to some embodiments.

In some embodiments, an interface to a block data storage service implementing using a fault-tolerant data storage system, such as interface 400 may allow a customer or client to specify a durability requirement for a volume to be allocated for the client in the block data storage service. While FIG. 4A illustrates a graphical user interface, in some embodiments, a block data storage service may include other types of interface for receiving a customer or client durability requirement for a volume, such as an application programmatic interface (API), command line interface, etc. An API refers to an interface and/or communication protocol between a client and a server, such that if the client makes a request in a predefined format, the client should receive a response in a specific format or initiate a defined action. In the cloud provider network context, APIs provide a gateway for customers to access cloud infrastructure by allowing customers to obtain data from or cause actions within the cloud provider network, enabling the development of applications that interact with resources and services hosted in the cloud provider network. APIs can also enable different services of the cloud provider network to exchange data with one another.

In some embodiments, an interface, such as interface 400, may include multiple volume request spaces, such as volume request spaces 402, 406, and 410 for volumes that the customer or client requests to be implemented for the client. Additionally, in some embodiments, a user interface, such as interface 400, may include durability selection areas, such as durability selection areas 404, 408, and 412, in the respective volume request spaces 402, 406, and 410. In some embodiments, a customer or client may select from a pre-defined set of durability requirements, such as standard durability, enhanced durability, superior durability, minimal durability, etc. In some embodiments, a customer or client may specify a durability requirement such as "5-9s" durability or a guarantee that 99.99999% of the client's data will not be lost. Also, in some embodiments an interface, such as interface 400, may include a submit button 414 to cause the requested volumes to be implemented with the specified durability characteristics.

While not shown in FIG. 4A, in some embodiments, a customer may be able to modify a durability requirement for an already implemented volume.

Figure 4B:
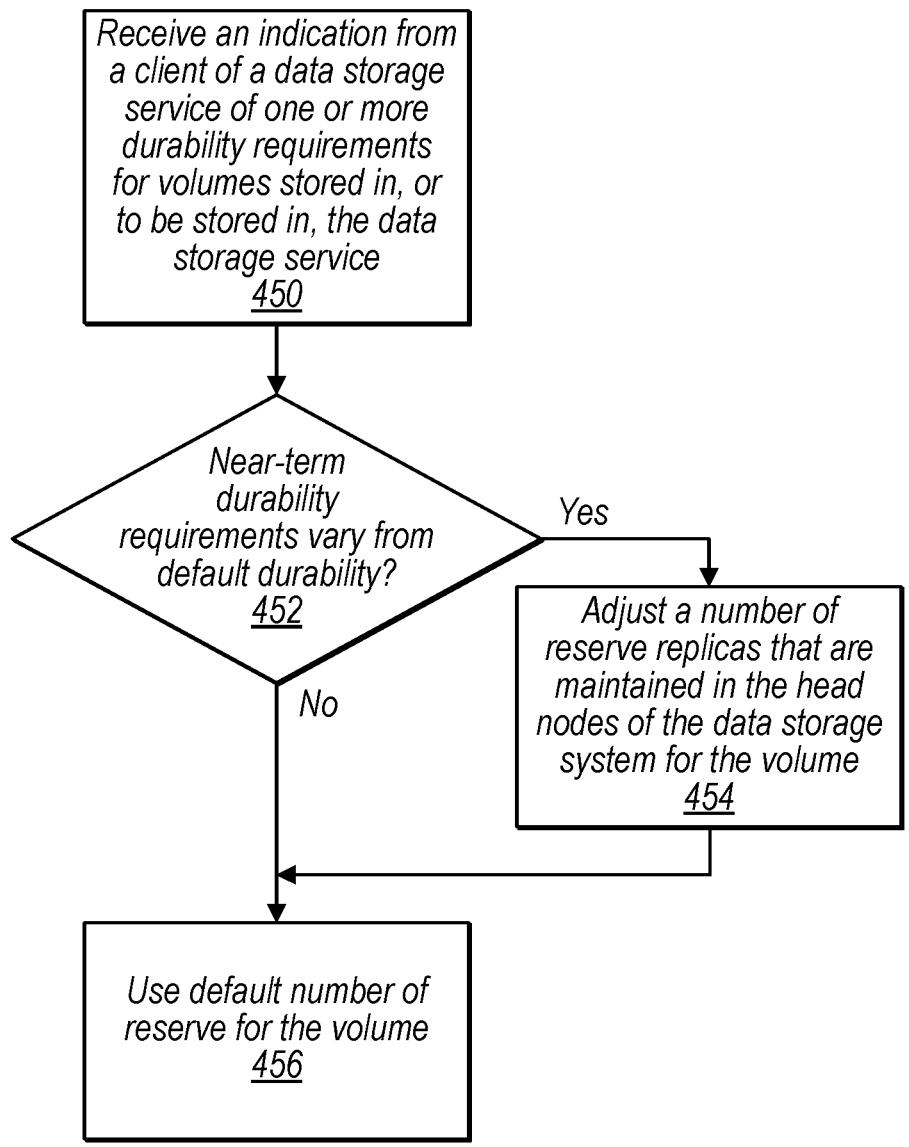
FIG. 4B illustrates an example process followed by a fault-tolerant data storage system to determine, based on a volume durability requirement, a number of secondary replicas to maintain for a volume partition in head nodes of the fault-tolerant data storage system, according to some embodiments.

FIG. 4B illustrates an example process followed by a fault-tolerant data storage system to determine, based on a volume durability requirement, a number of secondary replicas to maintain for a volume partition in head nodes of the fault-tolerant data storage system, according to some embodiments.

At 450, a fault-tolerant data storage system receives an indication from a customer or client of a data storage service regarding one or more durability requirements for a volume stored in, or to be stored in, the data storage service. For example, the indication may be received via a user interface as described in FIG. 4A.

At 452, a control plane of the fault-tolerant data storage system or of a data storage unit in the fault-tolerant data storage system, such as zonal control plane 304, or one of the local control planes 310, 322, or 338, determines if the near term durability requirements in relation to the customer or client specified durability requirement vary from default near term durability guarantees of the data storage system or a data storage unit that uses a default number of replicas, such as a primary replica and a secondary replica. If so, at 454, the control plane adjusts a number of secondary or reserve replicas that are maintained in the head nodes for the volume. For example in some embodiments, a single primary replica may be maintained for a minimal durability volume, two replicas, a primary replica and a secondary replica, may be maintained for a standard durability volume. In some embodiments, three replicas, a primary replica and two reserve replicas, may be maintained for an enhanced durability volume, and more than three replicas, such as a primary and more than two reserve replicas, may be maintained for a superior durability volume.

If not, at 456 the data storage system or the data storage unit uses the default head node replication scheme to store volume data for the volume.

Figure 4C:
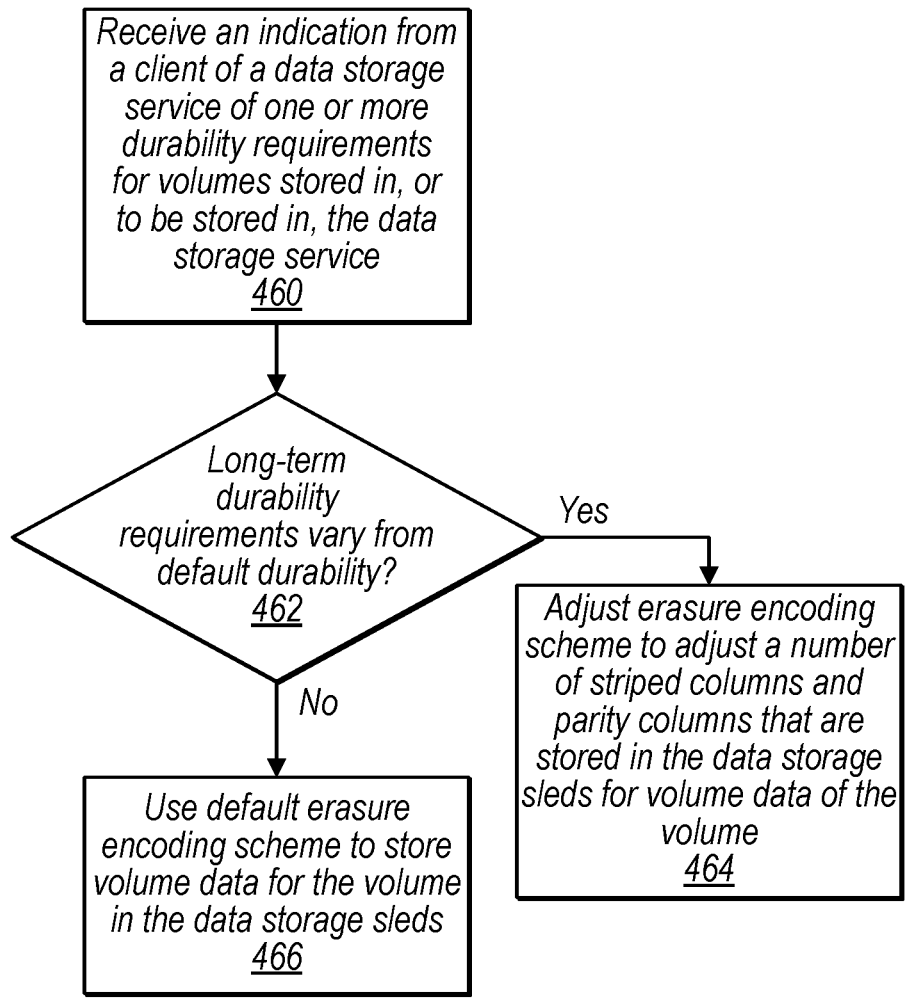
FIG. 4C illustrates an example process followed by a fault-tolerant data storage system to determine, based on a volume durability requirement, an erasure encoding scheme to use to store volume data for a volume partition in data storage sleds of the fault-tolerant data storage system, according to some embodiments.

FIG. 4C illustrates an example process followed by a fault-tolerant data storage system to determine, based on a volume durability requirement, an erasure encoding scheme to use to store volume data for a volume partition in data storage sleds of the fault-tolerant data storage system, according to some embodiments.

At 460, a fault-tolerant data storage system receives an indication from a customer or client of a data storage service regarding one or more durability requirements for a volume stored in, or to be stored in, the data storage service. For example, the indication may be received via a user interface as described in FIG. 4A. In some embodiments, the indication received at 460 may be the same indication received at 450.

At 462, the control of the fault-tolerant data storage system or a control plane of a data storage unit in the fault-tolerant data storage system, determines if the long term durability requirements in relation to the customer or client specified durability requirement vary from long term durability guarantees available using a default erasure encoding scheme. If so, at 464, the control plane adjusts an erasure encoding scheme used to erasure encode volume data flushed to the data storage sleds, such that the flushed volume data includes more or fewer striped columns and more or fewer parity columns stored on mass storage devices of different ones of the data storage sleds.

If not, at 466 the data storage system or the data storage unit uses the default erasure encoding scheme to store flushed volume data for the volume.

In some embodiments, the number of replicas chosen for a given volume partition or an erasure encoding scheme chosen for a given volume partition may further be based on an availability of background bandwidth from respective reserved background bandwidth pools. For example, for a volume partition having a medium durability requirement, the medium durability requirement may be satisfied using a first number of replicas, wherein shorter target times are determined to re-mirror a lost replica, or the medium durability requirement may be satisfied using a greater number of replicas and allowing longer times to re-mirror a lost replica.

Similarly, an erasure encoding scheme involving a number of stripe portions and parity portions may be selected taking into consideration an availability of background bandwidth to re-create a lost stripe portion or a lost parity portion. For example, if less background bandwidth is available, an erasure encoding scheme that tolerates more failures may be selected, whereas if more background bandwidth is available an erasure encoding scheme that utilizes fewer data storage sleds to store stripe portions and parity portions may be selected.

In this way, a fault-tolerant data storage system may balance efficiencies of storing fewer replicas and/or fewer stripe portions and parity portions against availability of background bandwidth to meet durability requirements. For example, storing fewer replicas may free up storage space to store volume data for other volumes and/or may free up foreground bandwidth because less communications are sent between the fewer number of replicas to perform reads and/or writes. Conversely, if background bandwidth is scarce, more replicas may be used to free up background bandwidth for use by other volume partitions.

Figure 4D:
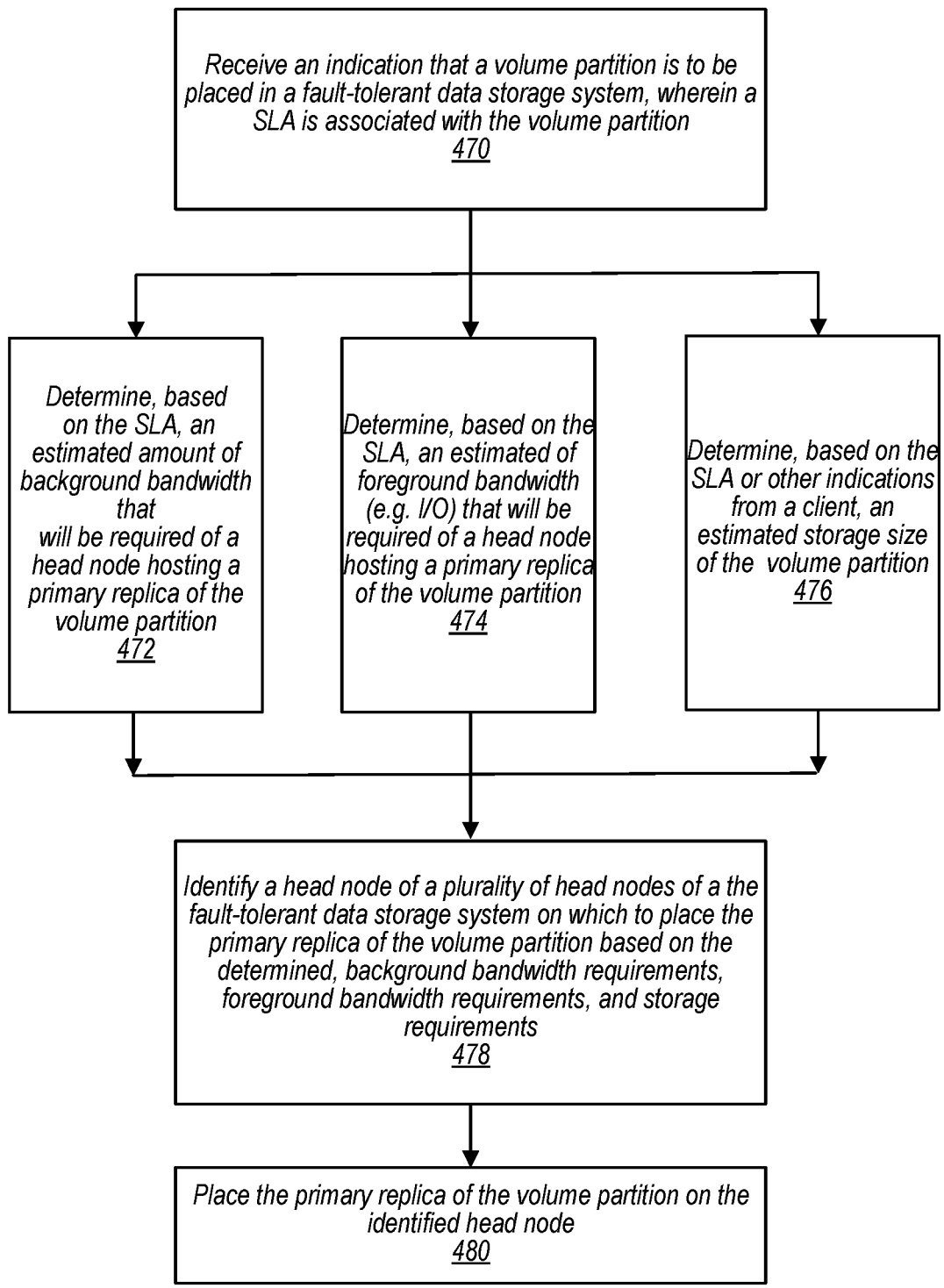
FIG. 4D illustrates an example process for determining a placement location for a volume partition in a fault-tolerant data storage system based on characteristics of the volume partition, such as a durability requirement, according to some embodiments.

FIG. 4D illustrates an example process for determining a placement location for a volume partition in a fault-tolerant data storage system based on characteristics of the volume partition, such as a durability requirement, according to some embodiments.

At 470, the fault-tolerant data storage system receives an indication that volume and/or volume partition is to be placed in the fault-tolerant data storage system. Also, the indication may include information indicating a service level agreement (SLA) associated with the volume/volume partition that is to be placed in the fault-tolerant data storage system.

In response to receiving the indication for placement, at 472, 474, and 476 various characteristics of the volume/volume partition to be placed may be determined. These characteristics may then be compared against respective capacities of head nodes for placement of a volume partition in order to select a set of head nodes at which to place the volume/volume partition. For example, at 472, an estimated amount of background bandwidth for the volume/volume partition may be determined based on a durability guarantee for the volume and/or based on a number of replicas/erasure encoding scheme to be used to store the volume/volume partition. Note that while not shown, the process described in FIG. 4A may additionally be performed in response to receiving the placement indication at 470. At 474, an estimated amount of foreground bandwidth needed to service the volume/volume partition is determined. For example, an SLA for the volume/volume partition may include a guaranteed quantity of IOPs to be provided for the volume/volume partition. At 476, a size of the volume/volume partition may be determined, such as how much storage space in the fault-tolerant data storage system will the volume/volume partition occupy.

At 478, based on the characteristics of the volume/volume partition determined at 472, 474, and 476 and based on respective capacities of the head nodes and/or data storage sleds of the fault-tolerant data storage system in these areas, a head node and/or data storage sleds to be used to place the volume/volume partition are selected.

At 480, the volume/volume partition is placed in the fault-tolerant data storage system using the system resources identified at 478.

Figure 5:
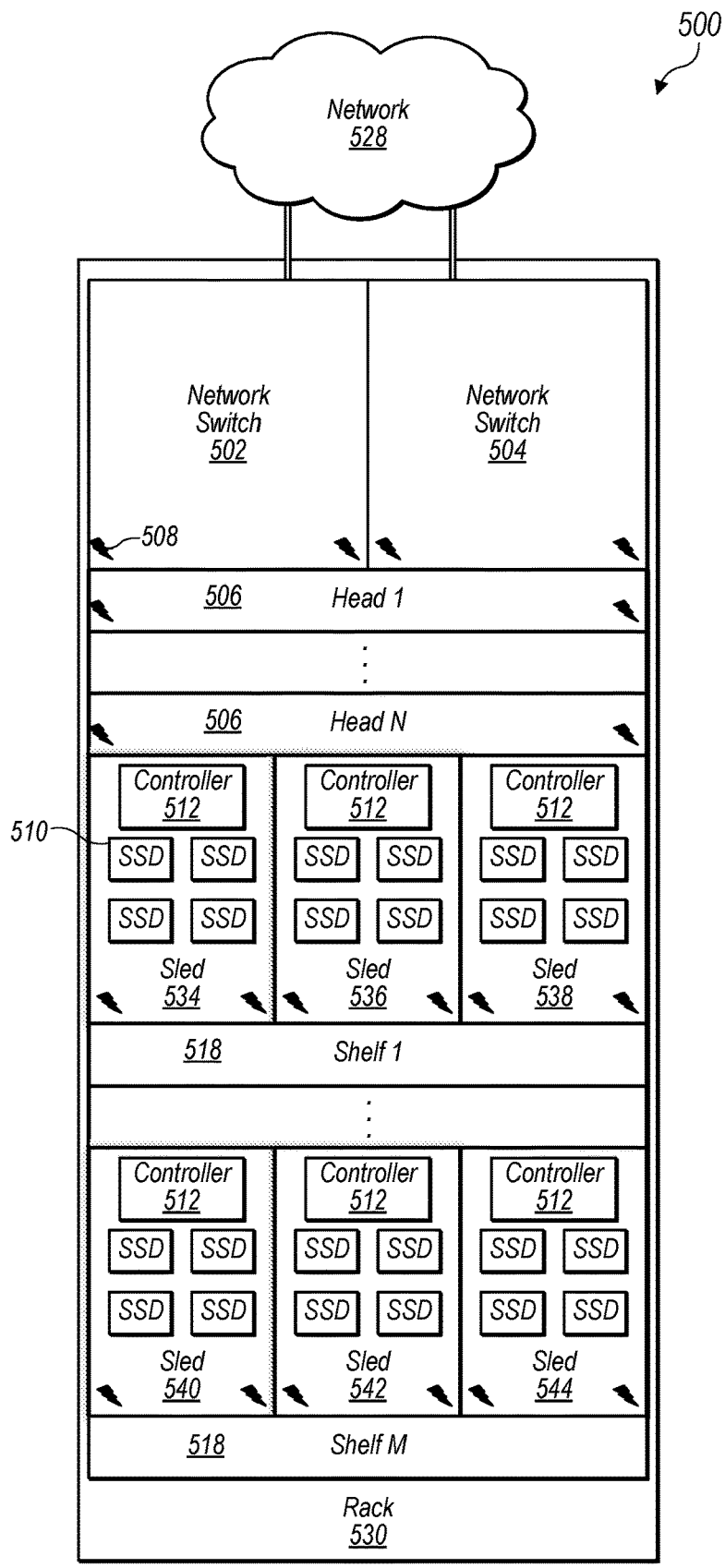
FIG. 5 illustrates an example data storage unit comprising multiple head nodes and data storage sleds, which may be included in a fault-tolerant data storage system, according to some embodiments.

FIG. 5 illustrates a data storage unit comprising head nodes and data storage sleds, according to some embodiments. Data storage unit 500, which may be included in a fault-tolerant data storage system, includes network switches 502 and 504, head nodes 506 and data storage sleds 534-544 on shelves 518. Each data storage sled 534-544 includes a sled controller 512 and mass storage devices 510. The head nodes 506, data storage sleds 534-544, and network switches 502 and 504 are mounted in rack 530. In some embodiments, networking devices, such as network switches 502 and 504, may be mounted in a position adjacent to and external from a rack of a data storage unit, such as rack 530 of data storage unit 500. A data storage unit may have redundant network connections to a network external to the data storage unit, such as network 528 that is connected to both network switch 502 and network switch 504. In some embodiments, components of a data storage unit, such as network switches 502 and 504, head nodes 506, and data storage sleds 534-544 may be connected to redundant power sources. For example, power connections 508 indicate power connections for network switches 502 and 504, head nodes 506, and data storage sleds 534-544. Note that power connections 508 are illustrated as a power symbol for simplicity of illustration, but may include various types of power connectors and power distribution systems. For example, power connectors of data storage unit components, such as head nodes and data storage sleds, may couple to dual power distribution systems within a data storage unit that receive power from dual power sources. In some embodiments, a data storage unit may include more than two redundant power distribution systems from more than two redundant power sources.

Each head node of a data storage unit, such as each of head nodes 506, may include a local data storage and multiple network interface cards. For example, a head node may include four network ports, wherein two network ports are used for internal communications, such as one network card being used for communications with other head nodes of a data storage unit and another network card being used for communications with other data storage sleds of a data storage unit, such as data storage sleds 534-544, and two of the network ports are used for external communications, for example via network 528. In some embodiments, each head node may be assigned two publicly routable network addresses that are routable from client devices in network 528 and may also be assigned two local network addresses that are local to a data storage unit and are routable for communications between the head node and data storage sleds of the data storage unit. Thus, a data storage unit, such as data storage unit 500, may include multiple redundant networks for communications within the data storage unit. In some embodiments, publicly routable network addresses may be used for internal communications between head nodes and data storage sleds and a head node may be assigned four publicly routable network addresses that are routable from client devices in network 528. The data storage unit may also include redundant power distribution throughout the data storage unit. These redundancies may reduce risks of data loss or downtime due to power or network failures. Because power and network failure risks are reduced via redundant power and network systems, volumes may be placed totally or at least partially within a single data storage unit while still meeting customer requirements for reliability and data durability.

Also, one or more head nodes of a data storage unit, such as one or more of head nodes 506, may function as a head node and additionally implement a local control plane for a data storage unit. In some embodiments, a local control plane may be implemented in a logical container separate from other control and storage elements of a head node. A local control plane of a data storage unit may select amongst any of the head nodes, such as any of head nodes 506, of the data storage unit when selecting a head node to designate as a primary head node for a volume or volume partition and may select amongst any of the remaining head nodes of the data storage unit when selecting one or more head nodes to designate as reserve or secondary head nodes for the volume or volume partition. For example a first one of head nodes 506 may be designated as a primary head node for a volume or volume partition and any of the remaining head nodes 506 may be selected as reserve head nodes for the volume or volume partition. In some embodiments, a given one of the head nodes 506 may be designated as a primary head node for a given volume or volume partition and may also be designated as a reserve head node for another volume or volume partition.

Additionally, any head node may be assigned or select columns of space on mass storage devices in any of the data storage sleds of a data storage unit for storing flushed data for a particular volume or volume partition. For example, any of head nodes 506 may reserve columns of space in mass storage devices 510 in any of data storage sleds 534-544. However, any particular column of space of a mass storage device may only be assigned to a single volume or volume partition at a time.

Because multiple head nodes and multiple data storage sleds are available for selection, and because each volume partition may be assigned two or more reserve head nodes (also referred to herein as secondary head nodes), a failure of a particular head node or a failure of a mass storage device in a particular data storage sled may not significantly reduce durability of data stored in the data storage unit. This is because, upon failure of a head node, a local control plane may designate another head node of the data storage unit to function as a replacement reserve head node for a volume or volume partition. Thus, for volumes that are stored using three or more head nodes to store three or more replicas (e.g. a primary replica and two or more reserve replicas) the volume is only without a secondary head node if two or more of the reserve head nodes for the volume fail, and in that rare circumstance, the volume is only without a secondary head node for a short period of time during which a replacement reserve head node is being designated and volume data is being re-mirrored from the primary head node to the replacement reserve head node. Furthermore, when a head node of a data storage unit fails, other head nodes of the data storage unit may still be able to access data in all of the storage sleds of the data storage unit. This is because no single data storage sled is exclusively assigned to any particular head node, but instead columns of space on individual mass storage devices of the data storage sleds are assigned to particular head nodes for particular volumes or volume partitions. This arrangement greatly reduces the blast radius of a head node failure or a disk failure as compared to other storage systems in which each server has a dedicated set of storage devices.

As discussed in more detail below, in some embodiments, a head node or local control plane of a data storage unit may be configured to re-create data stored on mass storage devices that are located in a data storage sled to other mass storage devices in other data storage sleds. Thus, for example, when a data storage sled with a failed mass storage device is removed from a data storage unit for replacement or repair, data from one or more non-failed mass storage devices in a data storage sled may still be available because the data has been re-created and stored to other data storage sleds of the data storage unit. For example, if a single mass storage device 510 in data storage sled 534 failed, data stored in the remaining mass storage devices 510 of data storage sled 534 may be replicated to mass storage devices 510 in any of data storage sleds 536-544. Thus while data storage sled 534 is removed from data storage unit 500 for repair or replacement of the failed mass storage device 510, data previously stored on the non-failed mass storage devices 510 of data storage sled 534 may still be available to head nodes 506.

Also, a data storage unit, such as data storage unit 500, may perform read and write operations independent of a zonal control plane. For example, each of head nodes 506 may be assigned one or more network addresses, such as IP addresses, that are advertised outside of data storage unit 500. Read and write requests may be routed to individual head nodes at the assigned network addresses of the individual head nodes via networking devices of the data storage unit, such as network switches 502 and 504, without the read and write requests being routed through a control plane external to the data storage unit, such as a control plane external to data storage unit 500.

In some embodiments, a data storage sled, such as one of data storage sleds 534-544, may include a sled controller, such as one of sled controllers 512. A sled controller may present the mass storage devices of the data storage sled to the head nodes as storage destination targets. For example head nodes and data storage sleds may be connected over an Ethernet network. In some embodiments, head nodes, such as head nodes 506 may communicate with mass storage devices 510 and vice versa via sled controllers 512 using a Non-volatile Memory Express (NVMe) protocol, or other suitable protocols. In some embodiments, each head node may be assigned multiple private network addresses for communication with data storage sleds over redundant internal Ethernet networks internal to a data storage unit. In some embodiments, a head node at an I/O processing software layer may perform a local disk operation to write or read from a mass storage device of a data storage sled and another software layer of the head node may encapsulate or convert the I/O operation into an Ethernet communication that goes through a networking device of the data storage unit to a sled controller in one of the data storage sleds of the data storage unit. A network interface of a head node may be connected to a slot on a motherboard of the head node, such as a PCIe slot, so that the mass storage devices of the data storage sleds appears to the operating system of the head node as a local drive, such as an NVMe drive. In some embodiments, a head node may run a Linux operating system or other type of operating system. The operating system may load standard drivers, such as NVMe drivers, without having to change the drivers to communicate with the mass storage devices mounted in the data storage sleds.

In some embodiments, a local control plane may be configured to designate more than one head node as a reserve/secondary head node for a volume or a volume partition and also adjust a number of mass storage devices that make up an erasure encoded RAID array for longer term storage of data for the data volume or volume partition. Thus if increased durability is desired for a particular volume or volume partition, the volume data may be replicated on "N" head nodes and subsequently stored across "M" mass storage devices in data storage sleds of the data storage unit, wherein the number "N" and the number "M" may be adjusted to achieve a particular level of durability. In some embodiments, such an arrangement may allow high levels of durability to be realized without having to store data for a data volume outside of a single data storage unit. Also, in such an arrangement, input/output operations may be performed more quickly because data for a particular volume is stored within a single data storage unit.

Also, a given head node may be designated as a primary head node or a reserve head node for multiple volumes. Furthermore, a zonal control plane of a data storage system or a local control plane of a data storage unit may balance volume placement across head nodes of a data storage unit. Because volumes are distributed amongst the head nodes, variations in peak IOPS to average IOPS may be reduced because while one volume may experience peak load other volumes serviced by a particular head node may experience less than peak IOPS load. In a similar manner, background bandwidth usage may be distributes, for example such that re-mirroring tasks are distributed amongst multiple head nodes instead of being concentrated on a single head node. For example, if a head node fails the head node may have stored replicas of volume partitions for which surviving replicas are distributed across multiple ones of the remaining head nodes. Thus the re-mirroring tasks also will be distributed across the multiple ones of the head nodes. In some embodiments, a zonal or local control plane may adjust head node designations or volume assignments to balance loads if volumes on a particular head node experience significantly more IOPS than volumes serviced by other head nodes.

While, FIG. 5 illustrates mass storage devices 510 as solid state drives, any suitable storage device may be used. For example, in some embodiments, mass storage devices 510 may include hard disk drives. Also, FIG. 5 illustrates networking devices 502 and 504 to be networking switches. However, in some embodiments, other suitable networking devices may be used such as routers, etc.

In some embodiments, a data storage unit, such as data storage unit 500, may be part of a fault-tolerant data storage system included in a larger provider network system. Also, in some embodiments more than one data storage unit may be included in a fault-tolerant data storage system used to implement a block storage service of a provider network. For example, FIG. 6 illustrates such an example provider network, according to some embodiments.

Figure 6:
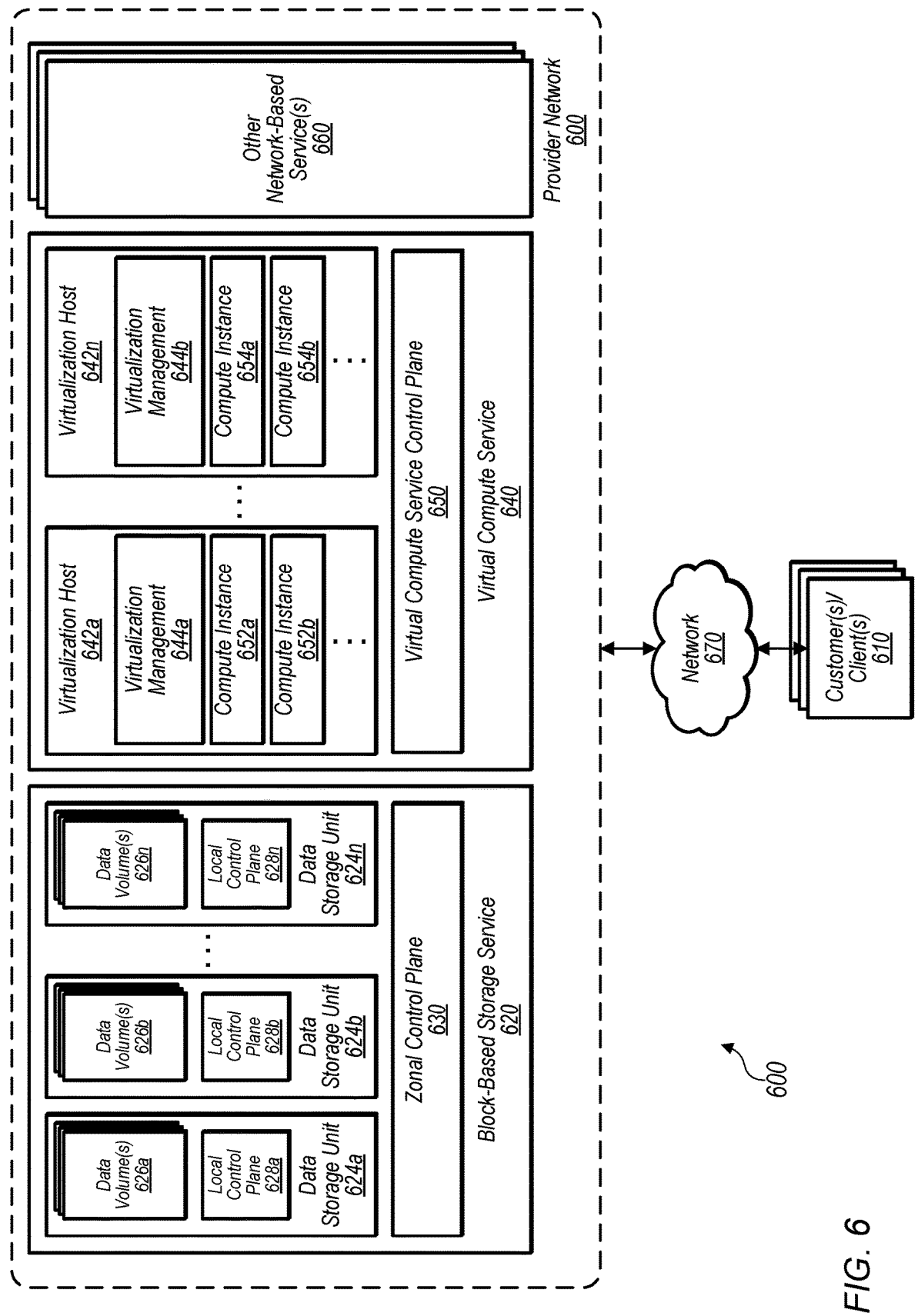
FIG. 6 is a block diagram illustrating a provider network implementing multiple network-based services including a block-based storage service that includes data storage units of a fault-tolerant data storage system, according to some embodiments.

FIG. 6 is a block diagram illustrating a provider network 600 that includes multiple network-based services such as a block-based storage service that implements dynamic resource creation to connect with customer resources, according to some embodiments. Provider network 600 may be set up by an entity such as a company or a public sector organization to provide one or more services (such as various types of cloud-based computing or storage) accessible via the Internet and/or other networks to customers 610. Provider network 600 may be a cloud provider network (sometimes referred to simply as a "cloud"), which refers to a pool of network-accessible computing resources (such as compute, storage, and networking resources, applications, and services), which may be virtualized or bare-metal. The cloud can provide convenient, on-demand network access to a shared pool of configurable computing resources that can be programmatically provisioned and released in response to customer commands. These resources can be dynamically provisioned and reconfigured to adjust to variable load. Cloud computing can thus be considered as both the applications delivered as services over a publicly accessible network (e.g., the Internet, a cellular communication network) and the hardware and software in cloud provider data centers that provide those services.

With cloud computing, instead of buying, owning, and maintaining their own data centers and servers, organizations can acquire technology such as compute power, storage, databases, and other services on an as-needed basis. The cloud provider network can provide on-demand, scalable computing platforms to users through a network, for example allowing users to have at their disposal scalable "virtual computing devices" via their use of the compute servers and block store servers. These virtual computing devices have attributes of a personal computing device including hardware (various types of processors, local memory, random access memory ("RAM"), hard-disk and/or solid state drive ("SSD") storage), a choice of operating systems, networking capabilities, and pre-loaded application software. Each virtual computing device may also virtualize its console input and output ("I/O") (e.g., keyboard, display, and mouse). This virtualization allows users to connect to their virtual computing device using a computer application such as a browser, application programming interface, software development kit, or the like, in order to configure and use their virtual computing device just as they would a personal computing device. Unlike personal computing devices, which possess a fixed quantity of hardware resources available to the user, the hardware associated with the virtual computing devices can be scaled up or down depending upon the resources the user requires. Users can choose to deploy their virtual computing systems to provide network-based services for their own use and/or for use by their customers or clients.

A cloud provider network can be formed as a number of regions, where a region is a separate geographical area in which the cloud provider clusters data centers. Each region can include two or more availability zones connected to one another via a private high speed network, for example a fiber communication connection. An availability zone (also known as an availability domain, or simply a "zone") refers to an isolated failure domain including one or more data center facilities with separate power, separate networking, and separate cooling from those in another availability zone. A data center refers to a physical building or enclosure that houses and provides power and cooling to servers of the cloud provider network. Preferably, availability zones within a region are positioned far enough away from one other that the same natural disaster should not take more than one availability zone offline at the same time. Customers can connect to availability zones of the cloud provider network via a publicly accessible network (e.g., the Internet, a cellular communication network) by way of a transit center (TC). TCs are the primary backbone locations linking customers to the cloud provider network, and may be collocated at other network provider facilities (e.g., Internet service providers, telecommunications providers) and securely connected (e.g. via a VPN or direct connection) to the availability zones. Each region can operate two or more TCs for redundancy. Regions are connected to a global network which includes private networking infrastructure (e.g., fiber connections controlled by the cloud provider) connecting each region to at least one other region. The cloud provider network may deliver content from points of presence outside of, but networked with, these regions by way of edge locations and regional edge cache servers. This compartmentalization and geographic distribution of computing hardware enables the cloud provider network to provide low-latency resource access to customers on a global scale with a high degree of fault tolerance and stability.

The cloud provider network may implement various computing resources or services, which may include a virtual compute service (referred to in various implementations as an elastic compute service, a virtual machines service, a computing cloud service, a compute engine, or a cloud compute service), data processing service(s) (e.g., map reduce, data flow, and/or other large scale data processing techniques), data storage services (e.g., object storage services, block-based storage services, or data warehouse storage services) and/or any other type of network based services (which may include various other types of storage, processing, analysis, communication, event handling, visualization, and security services not illustrated). The resources required to support the operations of such services (e.g., compute and storage resources) may be provisioned in an account associated with the cloud provider, in contrast to resources requested by users of the cloud provider network, which may be provisioned in user accounts.

Customers 610 may access these various services offered by provider network 600 via network 670. Likewise network-based services may themselves communicate and/or make use of one another to provide different services. For example, computing resources offered to customers 610 in units called "instances," such as virtual or physical compute instances, may make use of particular data volumes 626, providing virtual block-based storage for the compute instances. Also, note that any of the data storage units 624*a*, 624*b*, 624*n* may be data storage units such as data storage unit 500 illustrated in FIG. 5, which may be part of a fault-tolerant data storage system as described in FIGS. 1A-1E.

As noted above, virtual compute service 640 may offer various compute instances, such as compute instances 654*a* and 654*b* to customers 610. A virtual compute instance may, for example, comprise one or more servers with a specified computational capacity (which may be specified by indicating the type and number of CPUs, the main memory size, and so on) and a specified software stack (e.g., a particular version of an operating system, which may in turn run on top of a hypervisor). A number of different types of computing devices may be used singly or in combination to implement the compute instances of virtual compute service 640 in different embodiments, including special purpose computer servers, storage devices, network devices and the like. In some embodiments instance customers 610 or any other user may be configured (and/or authorized) to direct network traffic to a compute instance. In various embodiments, compute instances may mount, connect, attach or map to one or more data volumes 626 provided by block-based storage service 620 in order to obtain persistent block-based storage for performing various operations.

Compute instances may operate or implement a variety of different platforms, such as application server instances, Java™ virtual machines (JVMs), special-purpose operating systems, platforms that support various interpreted or compiled programming languages such as Ruby, Perl, Python, C, C++ and the like, or high-performance computing platforms) suitable for performing customer applications, without for example requiring the customer 610 to access an instance.

Compute instance configurations may also include compute instances with a general or specific purpose, such as computational workloads for compute intensive applications (e.g., high-traffic web applications, ad serving, batch processing, video encoding, distributed analytics, high-energy physics, genome analysis, and computational fluid dynamics), graphics intensive workloads (e.g., game streaming, 3D application streaming, server-side graphics workloads, rendering, financial modeling, and engineering design), memory intensive workloads (e.g., high performance databases, distributed memory caches, in-memory analytics, genome assembly and analysis), and storage optimized workloads (e.g., data warehousing and cluster file systems). Size of compute instances, such as a particular number of virtual CPU cores, memory, cache, storage, as well as any other performance characteristic. Configurations of compute instances may also include their location, in a particular data center, availability zone, geographic, location, etc., and (in the case of reserved compute instances) reservation term length.

As illustrated in FIG. 6, a virtualization host, such as virtualization hosts 642a and 642n, may implement and/or manage multiple compute instances 652a, 652b, 654a, and 654b respectively, in some embodiments, and may be one or more computing devices, such as computing device 1600 described below with regard to FIG. 16.

Virtualization hosts 642 may also provide multi-tenant hosting of compute instances. For example, in some embodiments, one virtualization host may host a compute instance for one entity (e.g., a particular customer or account of virtual computing service 610), while another compute instance hosted at the same virtualization host may be hosted for another entity (e.g., a different account). A virtualization host may include a virtualization management module, such as virtualization management modules 644a and 644b capable of instantiating and managing a number of different customer-accessible virtual machines or compute instances. The virtualization management module may include, for example, a hypervisor and an administrative instance of an operating system, which may be termed a "domain-zero" or "dom0" operating system in some implementations. The dom0 operating system may not be accessible by customers on whose behalf the compute instances run, but may instead be responsible for various administrative or control-plane operations of the network provider, including handling the network traffic directed to or from the compute instances.

Virtual computing service 640 may implement control plane 650 to perform various management operations. For instance, control plane 650 may implement resource management to place compute instances, and manage the access to, capacity of, mappings to, and other control or direction of compute instances offered by provider network. Control plane 650 may also offer and/or implement a flexible set of resource reservation, control and access interfaces for customers 610 via an interface (e.g., API). For example, control plane 650 may provide credentials or permissions to customers 610 such that compute instance control operations/ interactions between customers and in-use computing resources may be performed.

In various embodiments, control plane 650 may track the consumption of various computing instances consumed for different virtual computer resources, customers, user accounts, and/or specific instances. In at least some embodiments, control plane 650 may implement various administrative actions to stop, heal, manage, or otherwise respond to various different scenarios in the fleet of virtualization hosts 642 and instances 652, 654. Control plane 650 may also provide access to various metric data for customer(s) 610 as well as manage customer configured alarms.

In various embodiments, provider network 600 may also implement block-based storage service 620 for performing storage operations. In some embodiments, block based storage service may be implemented using a fault-tolerant data-storage system as described in FIGS. 1A-1E. In some embodiments, the head nodes and data storage sleds of the fault-tolerant data storage system may be included in data storage units as described in regard to FIG. 5.

Block-based storage service 620 is implemented using a fault-tolerant data storage system, composed of one or more computing devices implementing a zonal control plane 530 and a pool of multiple data storage units 624a, 624b through 624n (e.g., data storage units such as data storage unit 500 illustrated in FIG. 5), which provide block level storage for storing one or more sets of data volume(s) 626a, 626b through 626n. Data volumes 626 may be attached, mounted, mapped, or otherwise connected to particular clients (e.g., a virtual compute instance of virtual compute service 640), providing virtual block-based storage (e.g., hard disk storage or other persistent storage) as a contiguous set of logical blocks. In some embodiments, a data volume 626 may be divided up into multiple data chunks or partitions (including one or more data blocks) for performing other block storage operations, such as snapshot operations or replication operations. A volume snapshot of a data volume 626 may be a fixed point-in-time representation of the state of the data volume 626. In some embodiments, volume snapshots may be stored remotely from a data storage unit 624 maintaining a data volume, such as in another storage service 660. Snapshot operations may be performed to send, copy, and/or otherwise preserve the snapshot of a given data volume in another storage location, such as a remote snapshot data store in other storage service 660. In some embodiments, a block-based storage service, such as block-based storage service 620, may store snapshots of data volumes stored in the block-based storage service.

Block-based storage service 620 may implement zonal control plane 630 to assist in the operation of block-based storage service 620. In various embodiments, zonal control plane 630 assists in creating volumes on data storage units 624a, 624b, through 624n and moving volumes between data storage units 624a, 624b, through 624n. In some embodiments, access to data volumes 626 may be provided over an internal network within provider network 600 or externally via network 670, in response to block data transaction instructions.

Zonal control plane 630 may provide a variety of services related to providing block level storage functionality, including the management of user accounts (e.g., creation, deletion, billing, collection of payment, etc.). Zonal control plane 630 may implement capacity management, which may generate and manage a capacity model for storage service 620, and may direct the creation of new volumes on particular data storage units based on the capacity of storage service 620. Zonal control plane 630 may further provide services related to the creation and deletion of data volumes 626 in response to configuration requests.

Customers 610 may encompass any type of customer configured to submit requests to network provider 600. For example, a given customer 610 may include a suitable version of a web browser, or may include a plug-in module or other type of code module configured to execute as an extension to or within an execution environment provided by a web browser. Alternatively, a customer 610 may encompass an application such as a database application (or user interface thereof), a media application, an office application or any other application that may make use of compute instances, a data volume 626, or other network-based service in provider network 600 to perform various operations. In some embodiments, such an application may include sufficient protocol support (e.g., for a suitable version of Hypertext Transfer Protocol (HTTP)) for generating and processing network-based services requests without necessarily implementing full browser support for all types of network-based data. In some embodiments, customers 610 may be configured to generate network-based services requests according to a Representational State Transfer (REST)-style network-based services architecture, a document- or message-based network-based services architecture, or another suitable network-based services architecture. In some embodiments, a customer 610 (e.g., a computational client) may be configured to provide access to a compute instance or data volume 626 in a manner that is transparent to applications implemented on the customer 610 utilizing computational resources provided by the compute instance or block storage provided by the data volume 626.

Customers 610 may convey network-based services requests to provider network 600 via external network 670. In various embodiments, external network 670 may encompass any suitable combination of networking hardware and protocols necessary to establish network-based communications between customers 610 and provider network 600. For example, a network 670 may generally encompass the various telecommunications networks and service providers that collectively implement the Internet. A network 670 may also include private networks such as local area networks (LANs) or wide area networks (WANs) as well as public or private wireless networks. For example, both a given customer 610 and provider network 600 may be respectively provisioned within enterprises having their own internal networks. In such an embodiment, a network 670 may include the hardware (e.g., modems, routers, switches, load balancers, proxy servers, etc.) and software (e.g., protocol stacks, accounting software, firewall/security software, etc.) necessary to establish a networking link between given customer 610 and the Internet as well as between the Internet and provider network 600. It is noted that in some embodiments, customers 610 may communicate with provider network 600 using a private network rather than the public Internet.

In some implementations, at least a subset of virtualization management tasks may be performed at one or more offload cards so as to enable more of the processing capacity of the host to be dedicated to client-requested compute instances—e.g., cards connected via PCI or PCIe to the physical CPUs and other components of the virtualization host may be used for some virtualization management components. Such an offload card of the host can include one or more CPUs that are not available to customer instances, but rather are dedicated to instance management tasks such as virtual machine management (e.g., a hypervisor), input/output virtualization to network-attached storage volumes, local migration management tasks, instance health monitoring, and the like.

Figure 7A:
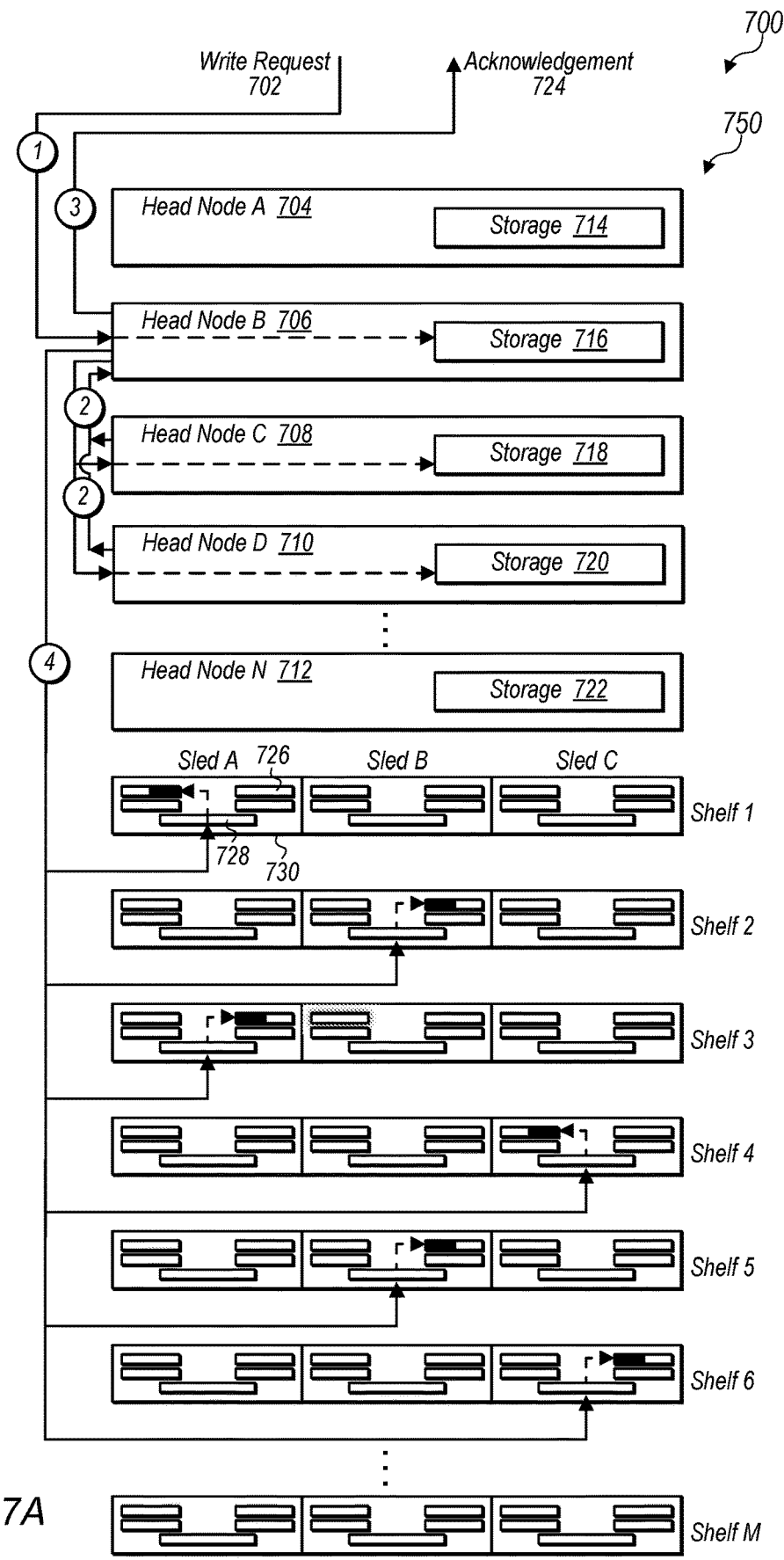
FIG. 7A is a block diagram illustrating head nodes and data storage sleds of a data storage unit of a fault-tolerant data storage system storing block storage data in response to a write request, according to some embodiments.

FIG. 7A is a block diagram illustrating head nodes and data storage sleds of a fault-tolerant data storage system storing block storage data in response to a write request, according to some embodiments. Head nodes 304, 306, 308, 310, and 312 illustrated in FIGS. 3A-3B may be the same as head nodes 120, 140, 160, and 180 illustrated in FIGS. 1A-1E and/or head nodes 506 illustrated in FIG. 5. Also, data storage sleds 330 may be the same as data storage sleds 194, 196, and 198 illustrated in FIGS. 1A-1E and/or data storage sleds, 534-544 illustrated in FIG. 5.

As discussed above, a fault-tolerant data storage system that includes a data storage unit, may store volume data in a data storage of a first head node designated as a primary head node for a volume or volume partition and may also replicate the volume data to one or more additional head nodes designated as reserve head nodes for the volume or volume partition. For example, at time 1, a write request 702 is routed to head node 706 that is designated as a primary head node for a volume or volume partition. At time 2 subsequent to the write request being received at head node 706, data included with the write request is stored in storage 716 of primary head node 706 and primary head node 706 causes the data included with the write request to be replicated to storages 718 and 720 of reserve head nodes 708 and 710, respectively. Replication of the data to reserve head nodes 708 and 710 is performed concurrently or nearly concurrently with storing the data in storage 716 of primary head node 706. Also, as shown in FIG. 7A at time 2, replication of the data to the reserve head nodes may include the reserve head nodes sending an acknowledgment back to the primary head node indicating that the data has been replicated to the reserve head nodes. Subsequently at time 3, which is also nearly concurrent with the data being stored in the storage of the primary head node and the data being replicated to the reserve head nodes, the primary head node, head node 706, may issue an acknowledgement 724 to the client device that requested write 702 has been committed in data storage system 700.

In some embodiments, a write request, such as write request 702, may be concurrently received at a primary head node and a reserve head node. In such embodiments, the primary head node may verify that the reserve head node has committed the write before acknowledging at time 3 that the write has been committed in the data storage system.

At a later point in time 4, e.g. asynchronous to times 1-3, the primary head node, e.g. head node 706, may cause data stored in storage 716, that includes the data included with the write request and that may include additional data stored before or after the write request, to be flushed to mass storage devices 726 of the data storage sleds 730 of the data storage unit. For example, at time 4 data is flushed to mass storage devices 726 of data storage sleds 730. In some embodiments, data is divided into portions and stored across multiple mass storage devices, each in a different sled and/or on a different shelf of a data storage unit. In some embodiments, data is also erasure encoded when stored in mass storage devices of data storage sleds. For example, data flushed from storage 716 of head node 706 may be divided into six portions where each portion is stored in a different mass storage device of a different data storage sled on a different shelf of a data storage unit 750 of data storage system 700 and is also erasure encoded across the different mass storage devices. For example data portions are stored in sled A of shelf 1, sled B of shelf 2, sled A of shelf 3, sled C of shelf 4, sled B of shelf 5, and sled C of shelf 6.

Also, as can be seen in FIG. 7A, a data storage unit, such as data storage unit 750, may include "M" number of shelves and "N" number of head nodes. The portions of data may be stored on portions of mass storage devices 726 in the respective data storage sleds 730. In order to distinguish between a portion of data and a portion of space on a mass storage device, a portion of space on a mass storage device may be referred to herein as a "column" of a mass storage device. Furthermore, a set of columns of mass storage devices that store different portions of data of a volume such as the columns shown in sled A of shelf 1, sled B of shelf 2, sled A of shelf 3, sled C of shelf 4, sled B of shelf 5, and sled C of shelf 6 may collectively make up what is referred to herein as an "extent." For example, in an erasure encoded RAID six array, an extent may include six columns that collectively make up the RAID array. Four of the columns may store striped data and two of the columns may store parity data. In some embodiments, other replication algorithms other than erasure encoding may be used such as quorum algorithms, etc.

In some embodiments, each column of an extent may be in a different fault domain of a data storage unit. For example, for the extent being stored in FIG. 7A each column is located in a different data storage sled that is mounted on a different shelf of the data storage unit 750. Thus a failure of a sled controller, such as one of sled controllers 728, may only affect a single column. Also if a power supply of a data storage sled fails it may only affect a single data storage sled or if a part of a power distribution system fails it may affect a single shelf. However, because each column of an extent may be located in a different shelf, a shelf level power event may only affect a single column of the extent.

In some embodiments, a head node of a data storage unit, such as one of head nodes 704, 706, 708, 710, or 712, may implement a local control plane. The local control plane may further implement an extent allocation service that allocates extents to head nodes designated as a primary head node for a volume or volume partition. In some embodiments, an extent allocation service may allocate a set of extents to a particular volume referred to herein as a "sandbox." The primary head node for the particular volume may then select extents to store data on during a data flush from the primary head node to data storage sleds of the data storage unit by selecting an extent from the sandbox allocated for the particular volume.

In some embodiments, if insufficient space is available in the particular volume's sandbox or if a particular placement would cause a data durability of data to be saved to fall below a minimum required durability for the particular volume, a primary head node for the particular volume may select columns outside of the particular volume's sandbox to write data for the particular volume. For example, a sandbox may include multiple columns that make up multiple extents in different ones of the data storage sleds 730 on different ones of the shelves of a data storage unit 750. A primary head node may be able to flush data to columns within a particular volume's sandbox without having to request extent allocation from a local control plane that implements an extent allocation service. This may further add durability and reliability to a data storage unit because a primary head node for the particular volume may continue to flush data even if communication is lost with a local control plane within the data storage unit. However, if space is not available or a placement would cause durability for a particular volume or volume partition to fall below a minimum threshold, a primary head node may flush data to columns outside of the particular volume's sandbox. In some embodiments, a primary head for a particular volume may flush data to columns outside the primary head node's sandbox without requesting an allocation from a local control plane that implements an extent allocation service. For example, a primary head node may store addresses for each sled controller in a data storage unit and may flush data to any sled controller in the data storage unit that is associated with mass storage devices with available columns.

In some embodiments, a sled controller of a data storage sled, such as sled controller 728, may implement a fencing protocol that prevents a primary head node from writing to columns for which another primary head node has assumed control after the primary head node has been superseded by another head node assuming the role of primary head node for a particular volume or volume partition. It should be pointed out that a reserve head node or other back-up head nodes may not flush data to data storage sleds and flushing may be limited to only being performed by a primary head node.

Because for a particular volume, the volume's data may be stored in a storage of a primary head node and replicated to one or more reserve head nodes and may later be moved to being stored across an extent of mass storage devices in different data storage sleds of a data storage unit, metadata comprising an index with pointers to where the data is stored may be used for subsequent read requests and write requests to locate the data. Also in some embodiments, storages of a head node may be log-structured such that incoming write request are written to the head of the log of the head node's log-structured storage. An index entry may be added indicating where the written data is stored in the head node's log and subsequently the index may be updated when the written data is flushed from the log of the primary head node to an extent comprising columns of mass storage devices of the data storage system.

In some embodiments, replication to the reserve head nodes may be performed synchronously with a write, whereas flushing of stored data, such as write data, from a primary head node to an extent implemented on a set of mass storage devices of the data storage sleds may be performed asynchronously with a write or a set of writes. For example, replicated writes to head nodes 708 and 710 from primary head node 706 may be performed synchronously with servicing write request 702 and prior to sending acknowledgment 724. Also, for example, flushing of data to data storage sleds 730 (performed at time 4) may be performed asynchronously with servicing write request 702 and after sending acknowledgment 724.

In some embodiments, a replicated write, replicated from a primary head node to a reserve head node, may include a current sequence number for the head nodes of a group of head nodes designated as primary or reserve head nodes for a particular volume partition to which the write is directed. In some embodiments, a reserve head node may store a greatest sequence number yet seen for the particular volume partition and may decline to perform a replicated write if a sequence number appended to a replicated write is inferior to a sequence number stored by the reserve head node for the particular volume partition.

In some embodiments, a primary head node, such as primary head node 706, may wait to receive a commitment acknowledgment from two or more reserve head nodes, such as reserve head nodes 708 and 710, before providing a commitment acknowledgement back to a customer, such as acknowledgement 724. For example, primary head node 706 may refrain from sending acknowledgment 724 until head node 708 and 710 have indicated that the volume data being replicated to head nodes 708 and 710 at time 2 has been written to storages 718 and 720 of the respective head nodes 708 and 710.

Figure 7B:
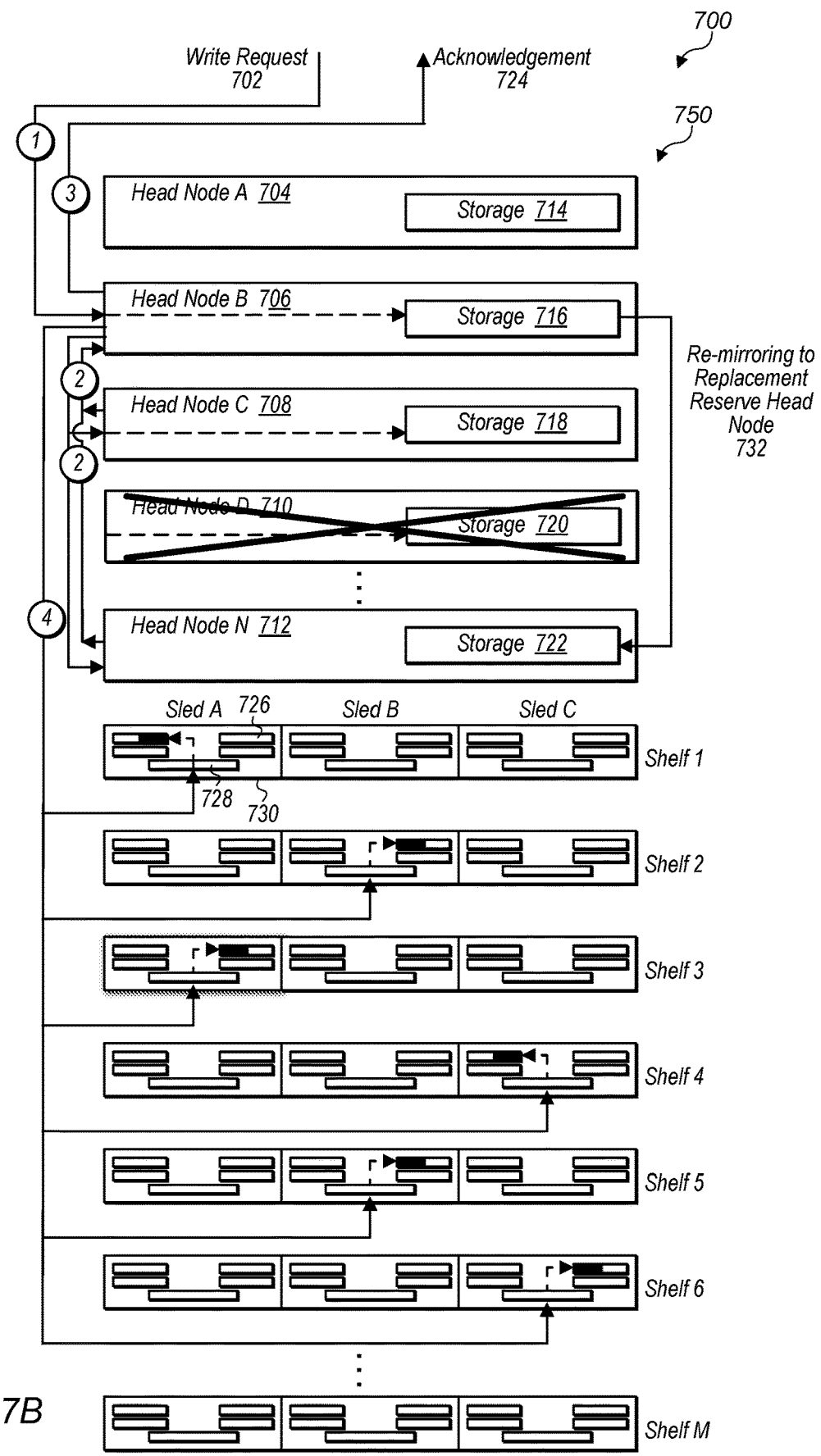
FIG. 7B is a block diagram illustrating head nodes of a data storage unit of a fault-tolerant data storage system re-mirroring data to a replacement head node for a volume partition, according to some embodiments.

FIG. 7B is a block diagram illustrating head nodes of a data storage unit re-mirroring data to a replacement head node for a volume partition, according to some embodiments.

As discussed above, in response to a failure of a reserve head node, such as reserve head node 710, a control plane of a data storage system or a data storage unit, such as a control plane of data storage system 700 or a local control plane of data storage unit 750, may designate another head node of the data storage unit as a reserve head node for a particular volume partition, wherein the reserve head node hosts a reserve replica of the particular volume partition. For example, a control plane may designate head node 712 as a replacement reserve replica. Additionally, a new sequence number may be issued for the head nodes hosting replicas for the particular volume partition. For example, a new sequence number may be issued to primary head node 706, reserve head node 708, and replacement reserve head node 712. As used herein, a server "hosting" a replica or a volume refers to the server storing at least a portion (e.g., a partition, a set of blocks) of the data of the volume and implementing instructions for managing the volume (e.g., I/O to and from the volume, replication of the volume, transfer of volume data to and from external storage systems).

In some embodiments, a primary head node, such as primary head node 706, may re-mirror volume partition data to the replacement reserve head node. For example, head node 706 performs re-mirroring 722 to replicate volume data and volume metadata (such as log index data) to the replacement reserve head node 712. The primary head node may include a newly issued sequence number with the data being re-mirrored to the replacement reserve head node. Also, the replacement reserve head node may not accept writes for the particular volume that include a sequence number inferior to the greatest sequence number for the volume partition seen by the replacement reserve head node. This may prevent a partially failed primary or reserve head node that has been removed from a membership group for a particular volume partition from overwriting volume data for the volume partition. For example, a failed or partially failed head node presenting a sequence number for a previous membership group for a particular volume partition would be prevented from causing data to be written for the particular volume partition on a head node included in a current membership group for the particular volume partition. This is because the former primary head node would have an inferior (e.g. smaller) sequence number than the current sequence number for the current membership group for the particular volume partition.

Figure 8A:
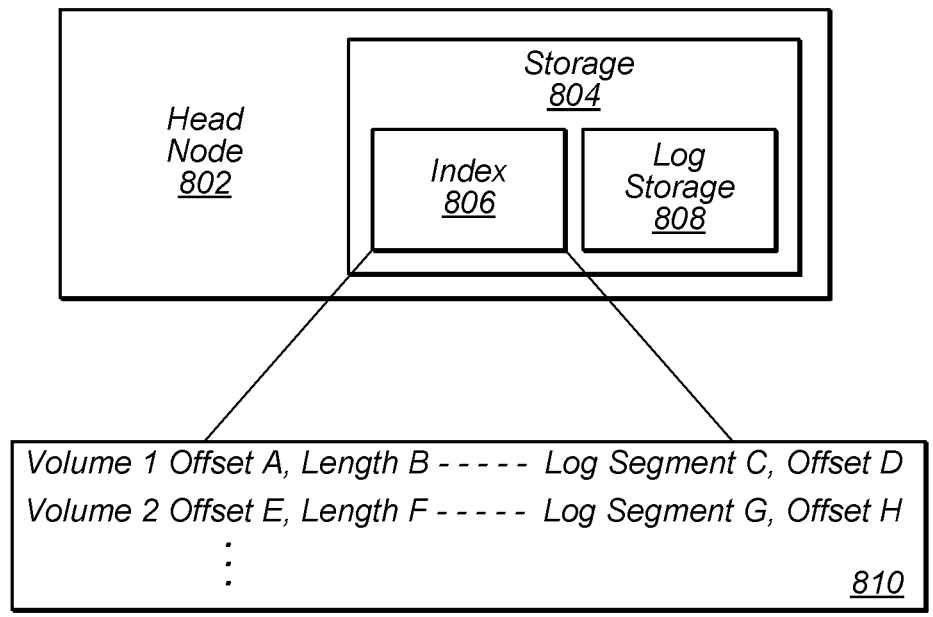
FIGS. 8A-8B are block diagrams illustrating a log storage and index of a head node storage, according to some embodiments.
Figure 8B:
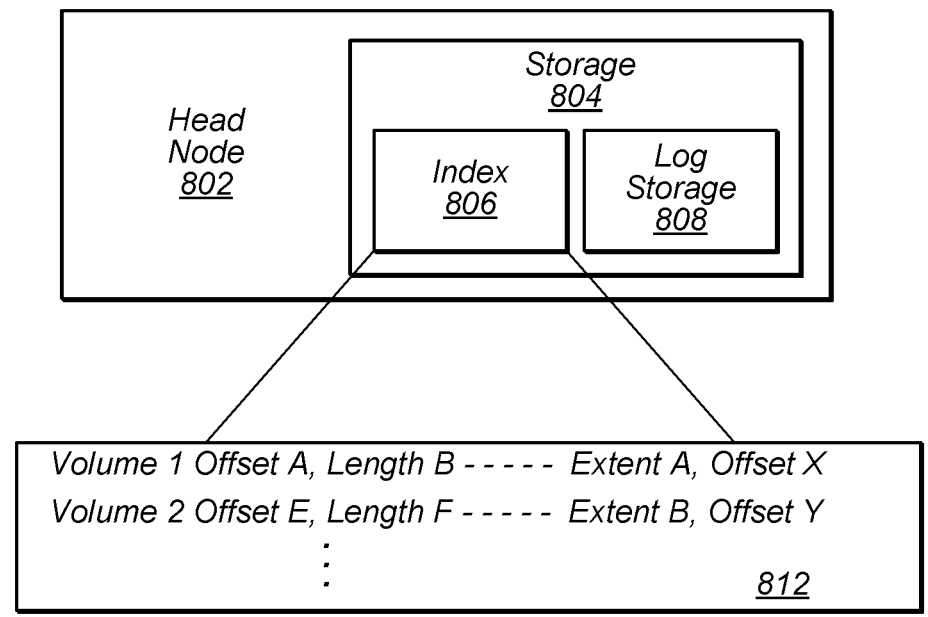

FIGS. 8A-8B are block diagrams illustrating a log-structured storage and an index of a head node storage, according to some embodiments. Head node 802 includes storage 804 that includes log 808 and index 806. Volume data may be stored in log 808 prior to being flushed to mass storage devices of a data storage unit. Index information 810 may include an entry for the volume data and a corresponding pointer to where the volume data is stored. For example, index information 810 indicates that data for volume 1, offset A, length B is stored in log storage 808 at log segment C and offset D. In some embodiments, a log of a head node such as log 808 of storage 804 of head node 802 may store data for more than one volume. For example, index information 810 also includes an entry for volume 2 offset E, length F and a corresponding pointer indicating the data for this volume entry is stored in log 808 at log segment G, offset H.

While FIGS. 8A-8B illustrate log storage 808 and index 806 as separate from each other, in some embodiments, an index, such as index 806, may lay on top of a log or side-by-side with a log, such as log storage 808.

When data for a volume is moved from a storage of a head node to being stored in an extent across multiple mass storage devices of a data storage unit, the data for the volume may be removed from a log of a head node storage and an index of the head node storage may be updated to indicate the new location at which the data for the volume is stored. For example, in FIG. 8B, index information 812 indicates that data for volume 1, offset A, length B is now stored at extent A, offset X and data for volume 2, offset E, length F is now stored at extent B, offset Y. Note that the labels "extent A" and "extent B" are used for ease of illustration. In some embodiments, an index may include addresses of data storage sleds where the data for the volume is located, such as local IP addresses of the data storage sleds, and addresses of the columns of the mass storage devices within the data storage sleds. In some embodiments, an index may include another label such as "extent A" where each head node stores information for locating "extent A" or may consult an extent allocation service for locating "extent A."

In some embodiments, an index may include addresses of data storage sleds where the data for the volume is located and sled controllers of the data storage sleds may be able to determine the appropriate columns based on volume IDs stored in respective columns allocated to the volume.

When a read request is received by a head node designated as a primary head node for a volume, the head node may consult an index of a storage of the head node, such as index 806 of storage 804, to determine what is the latest version of the volume's data and where the latest version of the volume's data is stored. For example a primary head node, such as head node 802, may consult the primary head node's index, such as index 806, to determine if the latest version of the volume's data is stored in the head node's log, such as log 808, or is stored in an extent comprising mass storage devices of the data storage unit.

Figure 9:
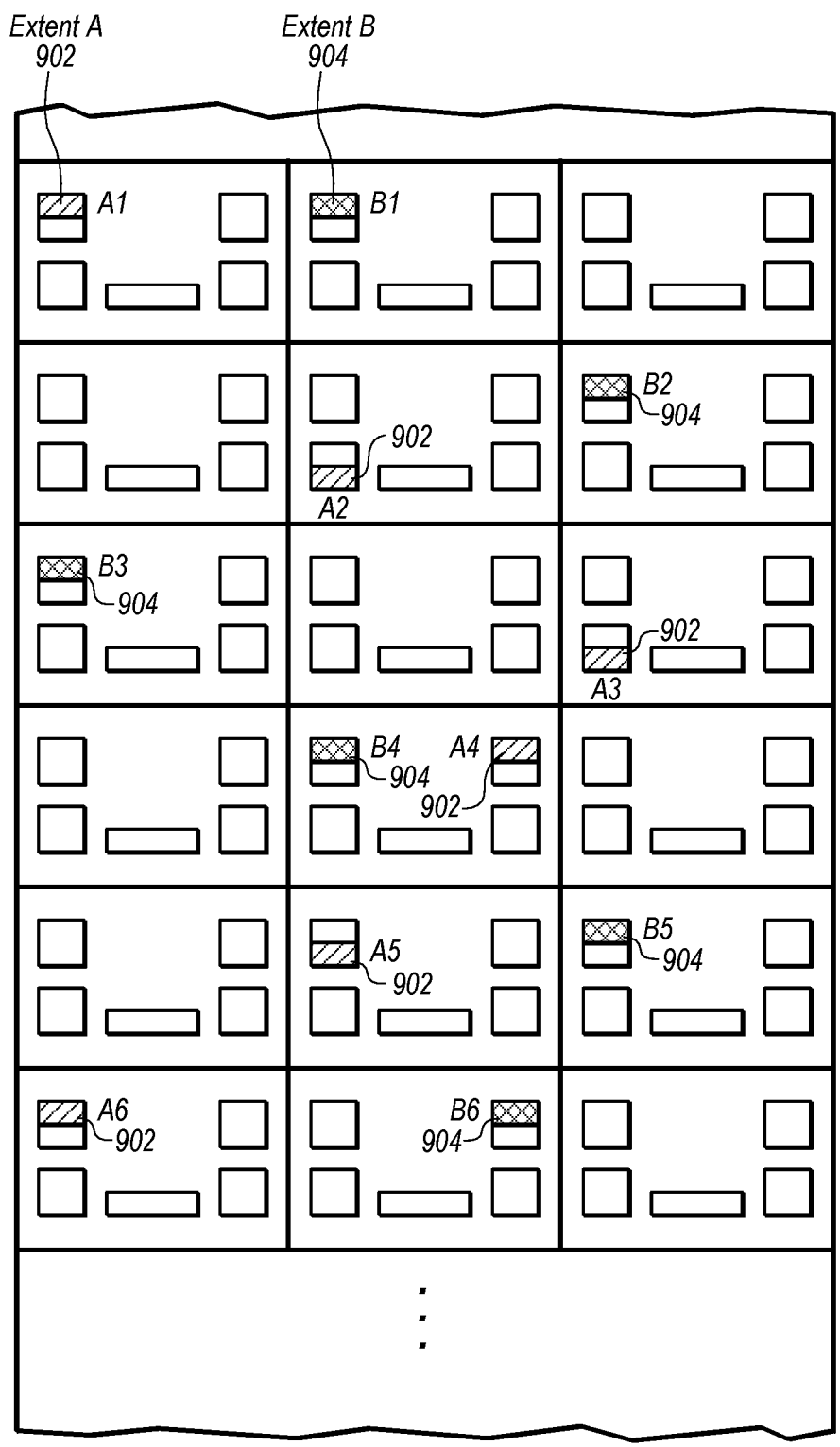
FIG. 9 illustrates a partial view of a data storage unit of a fault-tolerant data storage system, wherein the data storage unit stores portions of a volume partition in multiple mass storage devices in multiple data storage sleds on multiple shelves of the data storage unit, according to some embodiments.

FIG. 9 illustrates a partial view of a data storage unit that stores portions of a volume partition in multiple mass storage devices in multiple data storage sleds on multiple shelves of the data storage unit, according to some embodiments. FIG. 9 illustrates an example storage pattern for extent A from index 806 in FIG. 8B. Extent A from index 806 illustrated in FIG. 8B is shown as extent A 902 in FIG. 9 Also, an example storage pattern for extent B from index 806 illustrated in FIG. 8B is shown in FIG. 9 as extent B 904. Note that a data storage sled may include multiple columns of multiple extents. Also, in some embodiments a single mass storage device may include multiple columns of multiple extents.

Figure 10A:
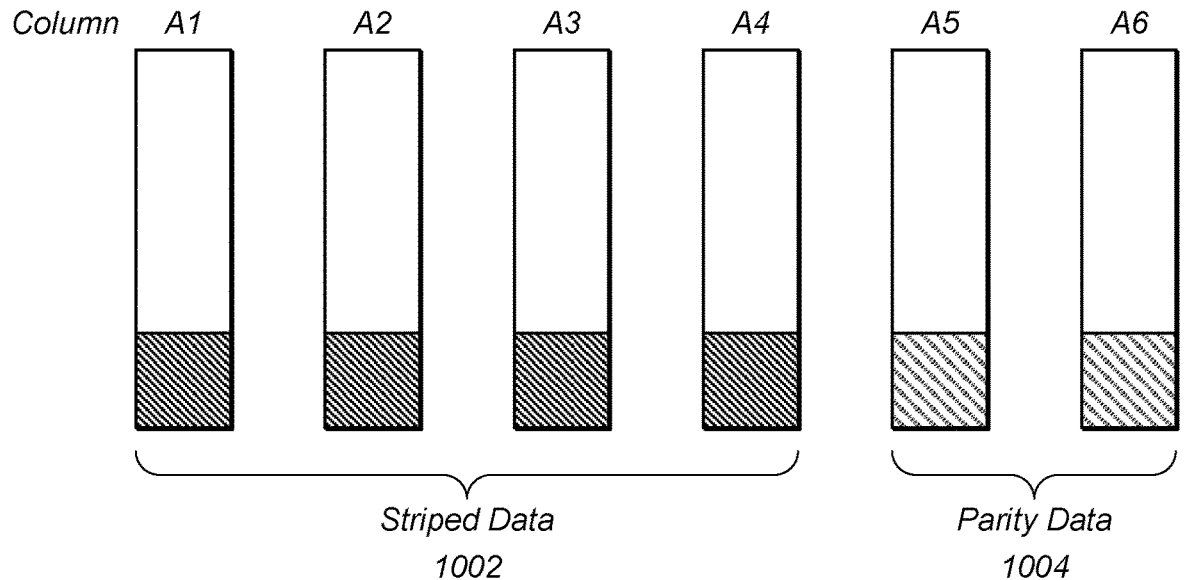
FIGS. 10A-10B illustrate columns of mass storage devices storing different portions of flushed volume data of a volume partition, according to some embodiments.
Figure 10B:
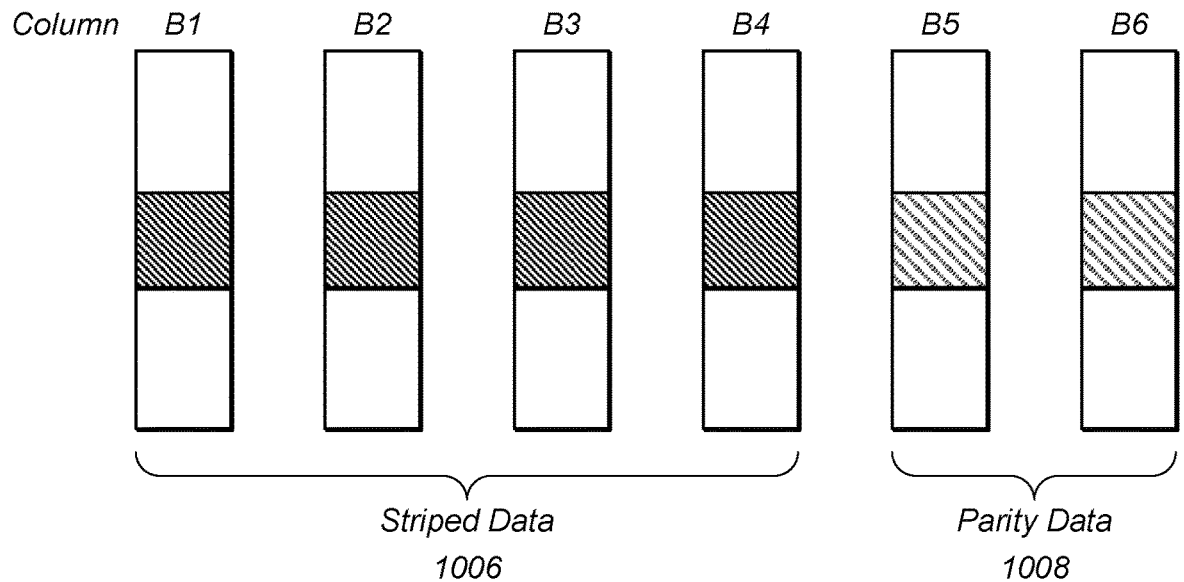

FIGS. 10A-B illustrate columns of mass storage devices storing different portions of a volume partition, according to some embodiments. FIG. 10A illustrates an embodiment in which data flushed to extent A, which may be the same extent A as described in FIGS. 8 and 9, is erasure encoded across 4+2 columns. The striped data 1002 may include the original data flushed from log 808 divided into multiple portions and the parity data 1004 may include encoded data that allows the flushed data to be recreated in case of failure of one or more of the mass storage devices or sleds that include one of the columns. FIG. 10B illustrates a similar embodiment where extent B is erasure encoded across four striped data columns 1006 and two parity columns 1008. Note that in FIG. 10B the data is stored in a different location in the column than is shown in FIG. 10A. This is intended to illustrate that the columns shown in FIG. 10B may already store data previously written to the columns of extent B, whereas the data being written to extent A may be the first set of data written to extent A. Also, it is worth noting that for a particular volume, multiple extents may be assigned to store data of the volume. In some embodiments, an extent may represent a fixed amount of storage space across a set number of columns of mass storage devices. When an extent is filled for a particular volume, another extent may be allocated to the volume by a head node or an extent allocation service. FIGS. 10A and 10B illustrate an example RAID level and erasure encoding technique. However, in some embodiments various other RAID levels may be used and various data coding techniques may be used to increase durability of stored data. It also worth noting that erasure encoding data may reduce a number of columns needed to achieve a particular level of durability. For example, data stored that is not erasure encoded may require the data to be stored redundantly across 8 columns to achieve a given level of durability, whereas a similar level of durability may be achieved by erasure encoding the data across fewer columns, such as 4+2 columns. Thus erasure encoding data may significantly reduce an amount of storage resources that are needed to store data to a particular level of durability. For example, data erasure encoded according to a 4+2 erasure coding scheme may be recreated from any four of the six columns, wherein the six columns include four columns of striped data segments and two columns of parity data segments.

FIGS. 11A-11D illustrate example erasure encoding schemes that may be used by a fault-tolerant data storage system to store flushed volume data in data storage sleds of the fault-tolerant data storage system, according to some embodiments.

Figure 11A:
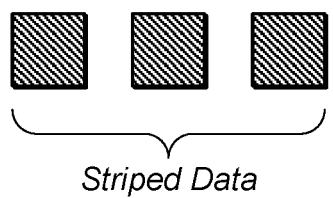
FIGS. 11A-11D illustrate example erasure encoding schemes that may be used by a fault-tolerant data storage system to store flushed volume data in data storage sleds of the fault-tolerant data storage system, according to some embodiments.
Figure 11A:
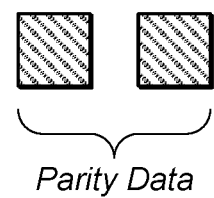
Figure 11B:
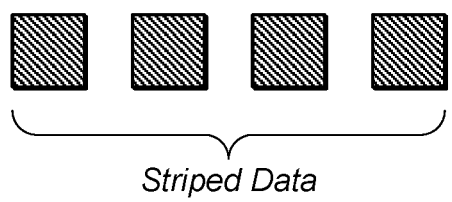
Figure 11B:
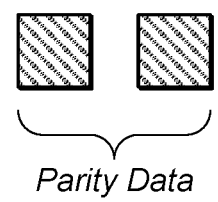
Figure 11C:
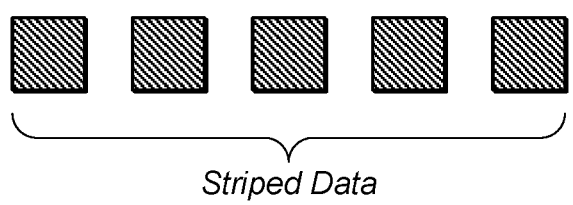
Figure 11C:
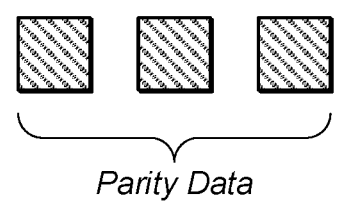
Figure 11D:
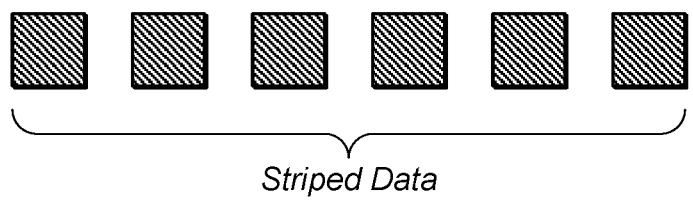
Figure 11D:
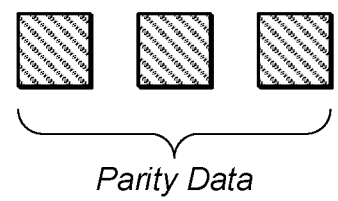

As discussed above, for example in regard to FIGS. 1A-1D and FIG. 4B, in some embodiments an erasure encoding scheme used to stored flushed volume data in the data storage sleds may be selected based on durability requirements of a service level agreement associated with a volume or volume partitions. For example, for some volumes with lower durability requirements a 3+2 erasure encoding scheme may be used, as illustrated in FIG. 11A. For other volumes with other durability requirements other erasure encoding schemes may be used such as a 4+2 erasure encoding scheme as illustrated in FIG. 11B, a 5+3 erasure encoding scheme as illustrated in FIG. 11C, or a 6+3 erasure encoding scheme as illustrated in FIG. 11D.

Figure 12:
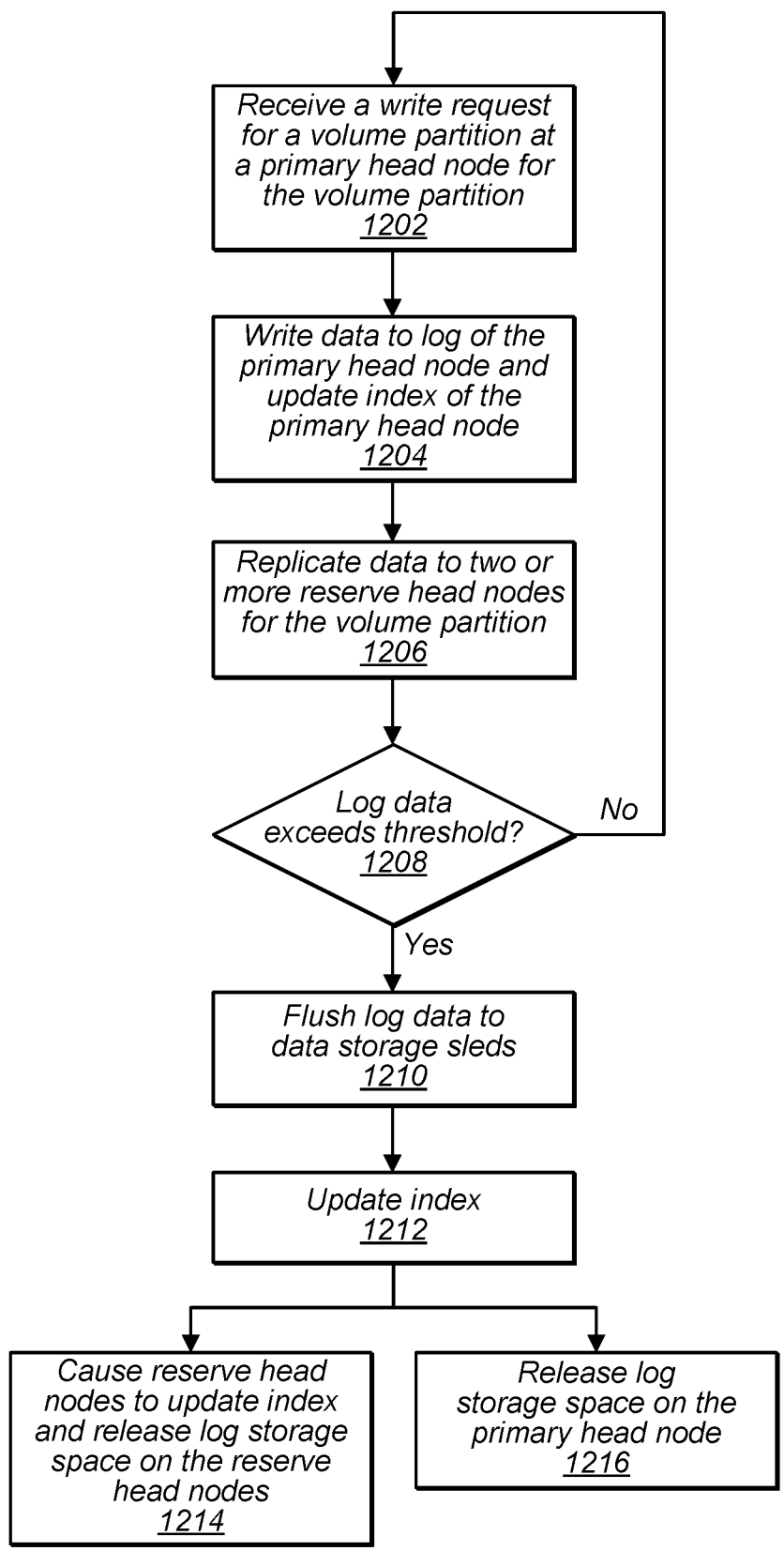
FIG. 12 is a high-level flowchart illustrating operations performed by a head node in response to a request to store data in a data storage unit of a fault-tolerant data storage system, according to some embodiments.

FIG. 12 is a high-level flowchart illustrating operations performed by a head node in response to a request to store data in a fault-tolerant data storage system, according to some embodiments.

At 1202, a fault-tolerant data storage system receives a write request from a client device directed to a volume partition hosted by the fault-tolerant data storage system and directs the write request to a head node of the fault-tolerant data storage system that is functioning as a primary head node for the volume partition.

At 1204, upon receiving the write request from the client device, the head node writes data included with the write request to the log of the head node and updates the index of the head node to include an entry for the volume data and a pointer indicating where the volume data is stored.

At 1206, the primary head node causes the data included with the write request to be replicated to one or more reserve head nodes. The reserve head nodes then store the data in respective logs of the reserve head nodes and update respective indexes of the respective storages of the reserve head nodes. For example, each of the reserve head nodes may update an index of the storage of the reserve head node to include an entry for the replicated volume data and a pointer indicating where the replicated volume data is stored. The reserve head nodes may then send respective acknowledgements to the primary head node indicating that the volume data has been replicated in the storages of the reserve head nodes. In some embodiments, the primary head node then issues an acknowledgement to the client device indicating that the requested write has been persisted in the data storage system. In some embodiments, replication between head nodes could be primary and reserve e.g. master/slave replication. In some embodiments, other replication techniques such as a Paxos protocol, other consensus protocol, etc. may be used to replicate data between head nodes.

At 1208, the primary head node determines if the log data of the primary head node exceeds a threshold that would trigger the log data or a segment of the primary head node's log data to be flushed to extents that include columns of mass storage devices of data storage sleds of a data storage unit that includes the head node. In some embodiments, a threshold to trigger data to be flushed may include: an amount of data stored in the log or in a segment of the log, an amount of time that has elapsed since the data was last accessed or altered, a frequency at which the data is accessed or altered, or other suitable thresholds. In some embodiments, data flushed from a log of a head node may only include a portion of the data written to the log of the head node or a segment of the log of the head node. For example, older data stored in a log of a head node may be flushed while more recently written data may remain in the log of the head node. In some embodiments, a frequency of flush operations from a log of a head node may be throttled based on a variety of factors, such as a fill rate of the log of the head node or based on an amount of write requests being received by the head node or being received for a particular volume serviced by the head node.

In response to determining the threshold has not been met, the primary head node continues to write data to the log and reverts to 1202.

At 1210, in response to determining that the threshold has been met or exceeded, the primary head node causes data stored in the log of the primary head node or a segment of the log of the primary head node to be flushed to columns of mass storage devices in different ones of a plurality of data storage sleds of the data storage unit.

At 1212, the primary head node updates the log of the primary head node to include a pointer for the volume data indicating that the flushed volume data is now stored in particular columns of mass storage devices or an extent that includes multiple columns of mass storage devices.

At 1214, the primary head node causes the reserve head nodes to update respective indexes of the reserve head nodes to indicate the new location of the volume data. The reserve head nodes also release the log space in the reserve head nodes that previously stored the replicated volume data.

At 1216, the head node acting as primary head node also releases space in the primary head node's log. In some embodiments, a garbage collection mechanism may cause log space to be released based on inspecting an index of a storage of a head node. In some embodiments, releasing log storage space may be performed concurrently with flushing log data or may be performed at some time subsequent to flushing log data.

Example Computer System

Figure 13:
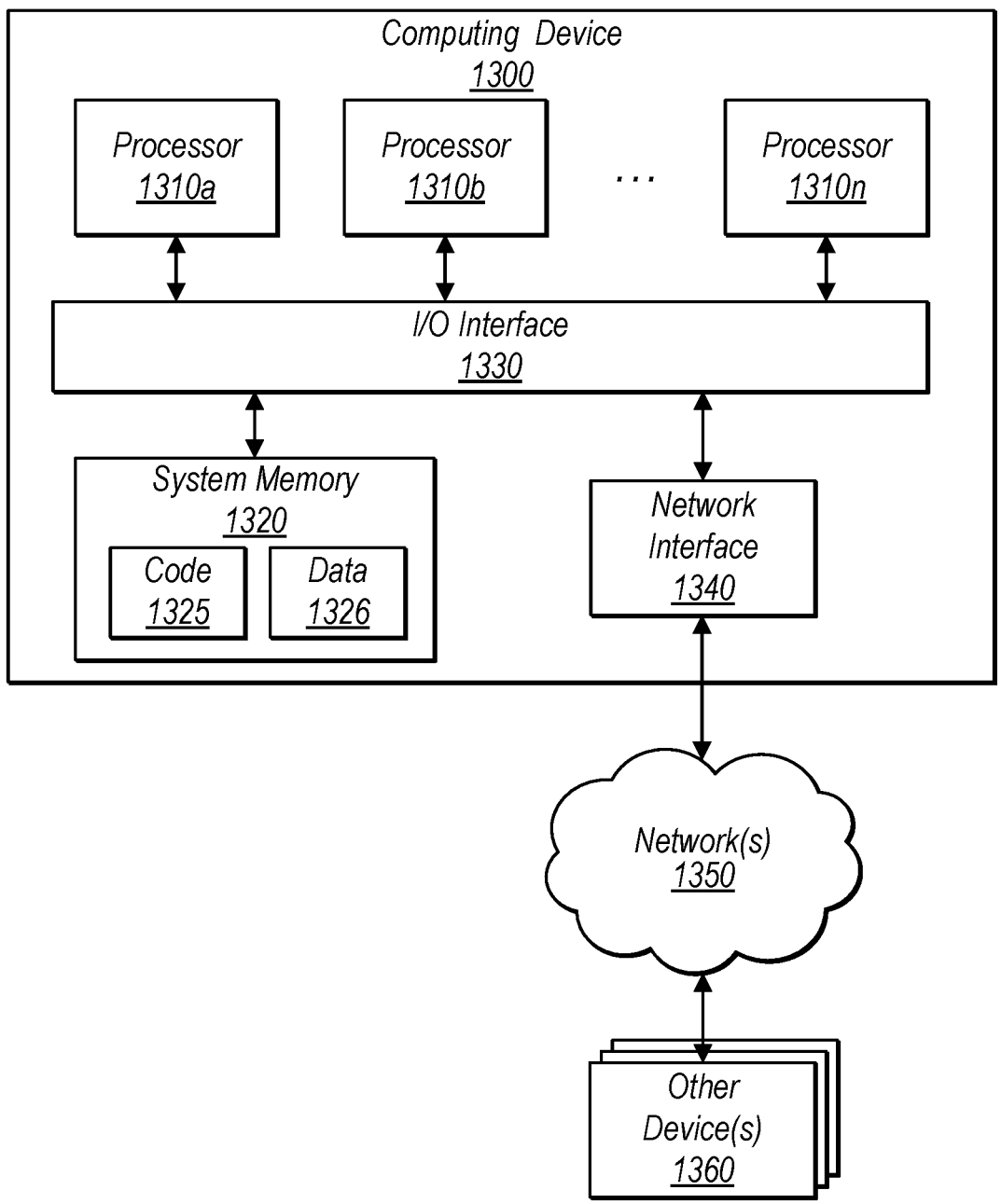
FIG. 13 is a block diagram illustrating an example computing system, according to some embodiments.

FIG. 13 is a block diagram illustrating an example computer system, according to various embodiments. For example, computer system 1300 may be configured to implement storage and/or head nodes of a data storage unit, storage and/or a sled controller of a data storage sled, other data stores, and/or a client, in different embodiments. Computer system 1300 may be any of various types of devices, including, but not limited to, a personal computer system, desktop computer, laptop or notebook computer, mainframe computer system, handheld computer, workstation, network computer, a consumer device, application server, storage device, telephone, mobile telephone, or in general any type of computing device.

Computer system 1300 includes one or more processors 1310 (any of which may include multiple cores, which may be single or multi-threaded) coupled to a system memory 1320 via an input/output (I/O) interface 1330. Computer system 1300 further includes a network interface 1340 coupled to I/O interface 1330. In various embodiments, computer system 1300 may be a uniprocessor system including one processor 1310, or a multiprocessor system including several processors 1310 (e.g., two, four, eight, or another suitable number). Processors 1310 may be any suitable processors capable of executing instructions. For example, in various embodiments, processors 1310 may be general-purpose or embedded processors implementing any of a variety of instruction set architectures (ISAs), such as the x86, PowerPC, SPARC, or MIPS ISAs, or any other suitable ISA. In multiprocessor systems, each of processors 1310 may commonly, but not necessarily, implement the same ISA. The computer system 1300 also includes one or more network communication devices (e.g., network interface 1340) for communicating with other systems and/or components over a communications network (e.g. Internet, LAN, etc.).

In the illustrated embodiment, computer system 1300 also includes one or more persistent storage devices 1360 and/or one or more I/O devices 1380. In various embodiments, persistent storage devices 1360 may correspond to disk drives, tape drives, solid state memory, other mass storage devices, block-based storage devices, or any other persistent storage device. Computer system 1300 (or a distributed application or operating system operating thereon) may store instructions and/or data in persistent storage devices 1360, as desired, and may retrieve the stored instruction and/or data as needed. For example, in some embodiments, computer system 1300 may host a storage unit head node, and persistent storage 1360 may include the SSDs that include extents allocated to that head node.

Computer system 1300 includes one or more system memories 1320 that are configured to store instructions and data accessible by processor(s) 1310. In various embodiments, system memories 1320 may be implemented using any suitable memory technology, (e.g., one or more of cache, static random access memory (SRAM), DRAM, RDRAM, EDO RAM, DDR 10 RAM, synchronous dynamic RAM (SDRAM), Rambus RAM, EEPROM, non-volatile/Flash-type memory, or any other type of memory). System memory 1320 may contain program instructions 1325 that are executable by processor(s) 1310 to implement the methods and techniques described herein. In various embodiments, program instructions 1325 may be encoded in platform native binary, any interpreted language such as Java™ byte-code, or in any other language such as C/C++, Java™, etc., or in any combination thereof. For example, in the illustrated embodiment, program instructions 1325 include program instructions executable to implement the functionality of a storage node, in different embodiments. In some embodiments, program instructions 1325 may implement multiple separate clients, nodes, and/or other components.

In some embodiments, program instructions 1325 may include instructions executable to implement an operating system (not shown), which may be any of various operating systems, such as UNIX, LINUX, Solaris™, MacOS™, Windows™, etc. Any or all of program instructions 1325 may be provided as a computer program product, or software, that may include a non-transitory computer-readable storage medium having stored thereon instructions, which may be used to program a computer system (or other electronic devices) to perform a process according to various embodiments. A non-transitory computer-readable storage medium may include any mechanism for storing information in a form (e.g., software, processing application) readable by a machine (e.g., a computer). Generally speaking, a non-transitory computer-accessible medium may include computer-readable storage media or memory media such as magnetic or optical media, e.g., disk or DVD/CD-ROM coupled to computer system 1300 via I/O interface 1330. A non-transitory computer-readable storage medium may also include any volatile or non-volatile media such as RAM (e.g. SDRAM, DDR SDRAM, RDRAM, SRAM, etc.), ROM, etc., that may be included in some embodiments of computer system 1300 as system memory 1320 or another type of memory. In other embodiments, program instructions may be communicated using optical, acoustical or other form of propagated signal (e.g., carrier waves, infrared signals, digital signals, etc.) conveyed via a communication medium such as a network and/or a wireless link, such as may be implemented via network interface 1340.

In some embodiments, system memory 1320 may include data store 1345, which may be configured as described herein. In general, system memory 1320 (e.g., data store 1345 within system memory 1320), persistent storage 1360, and/or remote storage 1370 may store data blocks, replicas of data blocks, metadata associated with data blocks and/or their state, configuration information, and/or any other information usable in implementing the methods and techniques described herein.

In one embodiment, I/O interface 1330 may be configured to coordinate I/O traffic between processor 1310, system memory 1320 and any peripheral devices in the system, including through network interface 1340 or other peripheral interfaces. In some embodiments, I/O interface 1330 may perform any necessary protocol, timing or other data transformations to convert data signals from one component (e.g., system memory 1320) into a format suitable for use by another component (e.g., processor 1310). In some embodiments, I/O interface 1330 may include support for devices attached through various types of peripheral buses, such as a variant of the Peripheral Component Interconnect (PCI) bus standard or the Universal Serial Bus (USB) standard, for example. In some embodiments, the function of I/O interface 1330 may be split into two or more separate components, such as a north bridge and a south bridge, for example. Also, in some embodiments, some or all of the functionality of I/O interface 1330, such as an interface to system memory 1320, may be incorporated directly into processor 1310.

Network interface 1340 may be configured to allow data to be exchanged between computer system 1300 and other devices attached to a network, such as other computer systems 1390, for example. In addition, network interface 1340 may be configured to allow communication between computer system 1300 and various I/O devices 1350 and/or remote storage 1370. Input/output devices 1350 may, in some embodiments, include one or more display terminals, keyboards, keypads, touchpads, scanning devices, voice or optical recognition devices, or any other devices suitable for entering or retrieving data by one or more computer systems 1300. Multiple input/output devices 1350 may be present in computer system 1300 or may be distributed on various nodes of a distributed system that includes computer system 1300. In some embodiments, similar input/output devices may be separate from computer system 1300 and may interact with one or more nodes of a distributed system that includes computer system 1300 through a wired or wireless connection, such as over network interface 1340. Network interface 1340 may commonly support one or more wireless networking protocols (e.g., Wi-Fi/IEEE 802.11, or another wireless networking standard). However, in various embodiments, network interface 1340 may support communication via any suitable wired or wireless general data networks, such as other types of Ethernet networks, for example. Additionally, network interface 1340 may support communication via telecommunications/telephony networks such as analog voice networks or digital fiber communications networks, via storage area networks such as Ethernet, Fibre Channel SANs, or via any other suitable type of network and/or protocol. In various embodiments, computer system 1300 may include more, fewer, or different components than those illustrated in FIG. 13 (e.g., displays, video cards, audio cards, peripheral devices, other network interfaces such as an ATM interface, an Ethernet interface, a Frame Relay interface, etc.)

It is noted that any of the distributed system embodiments described herein, or any of their components, may be implemented as one or more network-based services. For example, a compute cluster within a computing service may present computing and/or storage services and/or other types of services that employ the distributed computing systems described herein to customers as network-based services. In some embodiments, a network-based service may be implemented by a software and/or hardware system designed to support interoperable machine-to-machine interaction over a network. A network-based service may have an interface described in a machine-processable format, such as the Web Services Description Language (WSDL). Other systems may interact with the network-based service in a manner prescribed by the description of the network-based service's interface. For example, the network-based service may define various operations that other systems may invoke, and may define a particular application programming interface (API) to which other systems may be expected to conform when requesting the various operations. though In various embodiments, a network-based service may be requested or invoked through the use of a message that includes parameters and/or data associated with the network-based services request. Such a message may be formatted according to a particular markup language such as Extensible Markup Language (XML), and/or may be encapsulated using a protocol such as Simple Object Access Protocol (SOAP). To perform a network-based services request, a network-based services client may assemble a message including the request and convey the message to an addressable endpoint (e.g., a Uniform Resource Locator (URL)) corresponding to the network-based service, using an Internet-based application layer transfer protocol such as Hypertext Transfer Protocol (HTTP).

In some embodiments, network-based services may be implemented using Representational State Transfer ("RESTful") techniques rather than message-based techniques. For example, a network-based service implemented according to a RESTful technique may be invoked through parameters included within an HTTP method such as PUT, GET, or DELETE, rather than encapsulated within a SOAP message.

Although the embodiments above have been described in considerable detail, numerous variations and modifications may be made as would become apparent to those skilled in the art once the above disclosure is fully appreciated. It is intended that the following claims be interpreted to embrace all such modifications and changes and, accordingly, the above description to be regarded in an illustrative rather than a restrictive sense.

What is claimed is:

1. A data storage system, comprising:
a plurality of head nodes, wherein, for respective volume partitions stored in the data storage system, a first head node is designated as a primary head node for the respective volume partition and one or more additional head nodes are designated as secondary head nodes for the respective volume partition; and
wherein a primary head node for a given volume partition is configured to:
determine, based on a service level agreement for the given volume partition and a mean time to failure for the plurality of head nodes, a first target time to perform a re-mirroring for a lost replica stored by the primary head node or one of the one or more secondary head nodes, such that a durability requirement of the service level agreement for the given volume partition is met; and
allocate background bandwidth for performing the re-mirroring from a first pool of reserved background bandwidth of the head node such that the replica is re-mirrored within the determined first target time, wherein the first pool of reserved background bandwidth is a pool from which bandwidth is allocated to perform background operations for the given volume partition and other volume partitions for which the head node is designated as a primary head node.

2. The data storage system of claim 1 further comprising:
a plurality of data storage sleds comprising mass storage devices, wherein the mass storage devices are configured to store volume data flushed from respective ones of the head nodes designated as primary head nodes for the respective volume partitions, wherein the flushed volume data is erasure encoded and stored across mass storage device in a plurality of different ones of the data storage sleds,
wherein the primary head node for the given volume partition is further configured to
determine, based on the service level agreement for the given volume partition and a mean time to failure for the mass storage devices of the data storage sleds, a second target time to perform a re-creation of lost erasure encoded data such that the durability requirement of the service level agreement for the given volume partition is met; and
allocate background bandwidth from a second pool of reserved background bandwidth of the head node for performing the re-creation within the determined second target time, wherein the second pool of reserved background bandwidth is another pool from which bandwidth is allocated to perform background operations for the given volume partition and other volume partitions for which the head node is designated as the primary head node.

3. The data storage system of claim 2, wherein:
the service level agreement for the given volume partition corresponds to an enhanced durability volume type;
a second service level agreement for another given volume partition stored in the data storage system corresponds to a standard durability volume type; and
the head node is also designated as a primary head node for the other given volume partition,
wherein the primary head node for the other given volume partition is configured to:
determine, based on the second service level agreement for the other given volume partition and the mean time to failure for the plurality of head nodes, a different target time to perform a re-mirroring for a lost replica stored by the primary head node or one of the one or more secondary head nodes for the other given volume partition, such that a lower durability requirement of the second service level agreement for the other given volume partition is met; and
allocate background bandwidth from the first pool of reserved background bandwidth for performing the re-mirroring for the replica for the other given volume partition such that the replica is re-mirrored within the determined different target time; and
wherein the primary head node for the other given volume partition is further configured to:

determine, based on the second service level agreement for the other given volume partition and the mean time to failure for the mass storage devices of the data storage sleds, a different target time to perform a re-creation of lost erasure encoded data for the other given volume partition such that the lower durability requirement of the second service level agreement for the other given volume partition is met; and allocate background bandwidth from the second pool of reserved background bandwidth for performing the re-creation within the determined different target time.

4. The system of claim 1, further comprising:

one or more computing devices configured to:
- monitor instances of lost replicas stored by the head nodes and instances of lost erasure encoded volume data stored by the data storage sleds;
- update the mean time to failure for the head nodes based on the monitored instances of lost replicas, wherein the updated mean time to failure for the head nodes is used to determine subsequent target times for re-mirroring replicas; and
- update the mean time to failure for the data storage sleds based on the monitored instances of lost erasure encoded volume data, wherein the updated mean time to failure for the data storage sleds is used to determine subsequent target times for re-creating lost erasure encoded volume data.

5. A method comprising:

associating a service level agreement with one or more volume partitions of a volume stored in a fault-tolerant data storage system, wherein the service level agreement comprises a durability requirement for the volume;

determining, in response to a loss of a component of the fault-tolerant data storage system that stores an instance of volume data for a given one of the volume partitions of the volume, a target time to restore the instance of volume data on another component of the fault-tolerant data storage system, wherein the target time is determined based on the durability requirement of the service level agreement and a mean time to failure for a component type storing the instance of the volume data; and allocating background bandwidth for performing one or more tasks to restore the instance of the volume data on the other component of the fault-tolerant data storage system, wherein the background bandwidth is allocated for performing the one or more tasks from a shared pool of reserved background bandwidth such that the instance of the volume data is restored on the other component of the fault-tolerant data storage system within the target time determined based on the durability requirement of the service level agreement.

6. The method of claim 5, further comprising:

associating another service level agreement with one or more volume partitions of a different volume stored in the fault-tolerant data storage system, wherein the other service level agreement comprises a different durability requirement for the different volume;

determining, in response to a loss of a component of the fault-tolerant data storage system that stores an instance of volume data for a given one of the volume partitions of the different volume, a different target time to restore the instance of volume data of the different volume on another component of the fault-tolerant data storage system, wherein the different target time is determined based on the different durability requirement of the other service level agreement and the mean time to failure for a component type storing the instance of the volume data of the different volume; and allocating background bandwidth for performing one or more tasks to restore the instance of the volume data of the different volume on the other component of the fault-tolerant data storage system, wherein the background bandwidth is allocated for performing the one or more tasks from a shared pool of reserved background bandwidth such that the instance of the volume data of the different volume is restored on the other component of the fault-tolerant data storage system within the different target time determined based on the different durability requirement of the other service level agreement.

7. The method of claim 5, comprising:

updating one or more mean times to failure for one or more component types of the fault-tolerant data storage system, wherein said determining the target time to restore the instance of volume data is determined using at least one of the one or more updated mean times to failure for the one or more component types of the fault-tolerant data storage system.

8. The method of claim 7, comprising:

receiving, via an interface of the fault-tolerant data storage system, failure information for the one or more component types of the fault-tolerant data storage system, wherein said updating the one or more mean times to failure is performed using the received failure information for the one or more component types of the fault-tolerant data storage system.

9. The method of claim 7, comprising:

automatically tracking failures of components of the fault-tolerant data storage system, wherein said updating the one or more mean times to failure is automatically performed at scheduled time intervals using failure information generated based on the automatically tracked failures.

10. The method of claim 5, comprising:

implementing an application programmatic interface (API) for the fault-tolerant data storage system; and receiving, via the API, a volume type selection for the volume, wherein the volume type selection indicates a volume type selected from a plurality of volume types supported by the fault-tolerant data storage system, wherein said associating the service level agreement with the one or more volume partitions of the volume is performed based on the received volume type selection.

11. The method of claim 5, wherein the fault-tolerant data storage system comprises:

a plurality of head nodes, wherein, for respective ones of the volume partitions of the volume stored in the fault-tolerant data storage system, a first head node is designated as a primary head node for the respective volume partition and one or more additional head nodes are designated as secondary head nodes for the respective volume partition; and a plurality of data storage sleds comprising mass storage devices, wherein the mass storage devices are configured to store volume data flushed from respective ones of the head nodes designated as primary head nodes for the respective volume partitions, wherein the flushed volume data is erasure encoded and stored across mass storage device in a plurality of different ones of the data storage sleds, wherein the lost component of the fault-tolerant data storage system that stores an instance of volume data for the given one of the volume partitions of the volume is:
- a primary head node or a secondary head node storing a replica of volume data for the given volume partition; or
- a mass storage device of a data storage sled storing erasure encoded volume data for the given volume partition.

12. The method of claim 11, further comprising:
determining a number of replicas of volume data for the volume partitions of the volume that are to be stored in different ones of the plurality of head nodes of the fault-tolerant data storage system based on the received volume type selection.

13. The method of claim 11, further comprising:
determining an erasure encoding format that is to be used to store flushed volume data for the volume partitions based on the received volume type selection.

14. The method of claim 11, wherein the first head node designated as the primary head node maintains at least two reserved pools of background bandwidth, wherein the at least two pools comprise:
- a first pool of reserved background bandwidth for communications between the first head node and other head nodes of the fault-tolerant data storage system; and
- a second pool of reserved background bandwidth for communications between the first head node and the data storage sleds of the fault-tolerant data storage system.

15. The method of claim 14, further comprising:
determining a number of replicas of volume data for the given volume partition that are to be stored in different ones of the plurality of head nodes of the fault-tolerant data storage system based on a service level agreement associated with the volume and an availability of background bandwidth of the first pool of reserved background bandwidth; and
determining an erasure encoding format to be used to store volume data for the given volume partition that has been flushed to the mass storage devices of the data storage sleds based on the service level agreement associated with the volume and an availability of background bandwidth of the second pool of reserved background bandwidth,
wherein more replicas are determined to be used to store volume data for the given volume partition if the first pool of reserved background bandwidth has less availability of background bandwidth and less replicas are determined to be used to store volume data for the given volume partition if the first pool of reserved background bandwidth has more availability of background bandwidth; and
wherein an erasure encoding format utilizing a greater number of data storage sleds is determined to be used store the volume data for the given volume partition that has been flushed to the mass storage devices of the data storage sleds if the second pool of reserved background bandwidth has less availability of background bandwidth and an erasure encoding format utilizing fewer data storage sleds is determined to be used to store the volume data for the given volume partition that has been flushed to the mass storage devices of the data storage sleds if the second pool of reserved background bandwidth has more availability of background bandwidth.

16. The method of claim 14, wherein the first head node designated as the primary head node uses a separate allocation of foreground bandwidth to receive volume access requests from clients of the fault-tolerant data storage system and to replicate data included in write request between the first head node and one or more other head nodes designated as one or more secondary head nodes for the given volume partition,
the method further comprising:
temporarily augmenting the first or second pool of reserved background bandwidth, in response to background bandwidth utilization from the first or second pool exceeding a threshold amount concurrently with utilization of the foreground bandwidth falling below another threshold amount.

17. The method of claim 5, wherein said determining the target time to restore the instance of volume data on another component of the fault-tolerant data storage system is further determined based on:
a remaining number of instances of the volume data that are stored on other components of the fault-tolerant data storage system, wherein:
shorter target times are determined if a smaller number of instances are stored; and
longer target times are determined if a larger number of instances are stored,
wherein the instances of the volume data comprise:
- replicas of volume data of the given volume partition; or
- stripe or parity portions of erasure encoded flushed volume data for the given volume partition, wherein the lost instance of volume data is a stripe portion or a parity portion of the erasure encoded volume data for the given volume partition.

18. The method of claim 5, comprising:
receiving a request to place a new volume in the fault-tolerant data storage system;
identifying a head node of the fault-tolerant data storage system to be designated as a primary head node for a volume partition of the new volume, wherein the head node is identified, based at least in part:
an amount of unused storage capacity of the head node;
an amount of available input/output (TOPS) capacity of the head node; and
an amount of available background bandwidth of the head node; and
placing the new volume in the fault-tolerant data storage system such that the identified head node is designated as the primary head node for the volume partition of the new volume.

19. One or more non-transitory, computer-readable storage media, storing program instructions that when executed on or across one or more computing devices cause the one or more computing devices to:
associate a service level agreement with one or more volume partitions of a volume stored in a fault-tolerant data storage system, wherein the service level agreement comprises a durability requirement for the volume;
determine, in response to a loss of a component of the fault-tolerant data storage system that stores an instance of volume data for a given one of the volume partitions of the volume, a target time to restore the instance of volume data on another component of the fault-tolerant data storage system, wherein the target time is determined based on the durability requirement of the service level agreement and a mean time to failure for a component type storing the instance of the volume data; and allocate background bandwidth for performing one or more tasks to restore the instance of the volume data on the other component of the fault-tolerant data storage system, wherein the background bandwidth is allocated for performing the one or more tasks from a shared pool of reserved background bandwidth such that the instance of the volume data is restored on the other component of the fault-tolerant data storage system within the target time determined based on the durability requirement of the service level agreement.

20. The one or more non-transitory computer-readable storage media of claim 19, wherein the program instructions, when executed on or across the one or more computing devices cause the one or more computing devices to:

implement a user interface for selecting a volume type for a volume stored, or to be stored, in the fault-tolerant data storage system, wherein the fault-tolerant data storage system supports a plurality of different volume types comprising at least a standard durability volume type and an enhanced durability volume type; and receive, via the user interface, a volume type selection for the volume stored, or to be stored, in the fault-tolerant data storage system, wherein the service level agreement associated with the one or more volume partitions is a service level agreement corresponding to the selected volume type for the volume.

* * * * *